(12) United States Patent
Scanlan et al.

(10) Patent No.: US 8,796,561 B1
(45) Date of Patent: Aug. 5, 2014

(54) FAN OUT BUILD UP SUBSTRATE STACKABLE PACKAGE AND METHOD

(75) Inventors: Christopher M. Scanlan, Chandler, AZ (US); Roger D. St. Amand, Tempe, AZ (US); Jae Dong Kim, Seoul (KR)

(73) Assignee: Amkor Technology, Inc.

( * ) Notice: Subject to any disclaimer, the term of this patent is extended or adjusted under 35 U.S.C. 154(b) by 473 days.

(21) Appl. No.: 12/573,466

(22) Filed: Oct. 5, 2009

(51) Int. Cl.
*H01L 23/48* (2006.01)
*H05K 1/16* (2006.01)
*H05K 1/18* (2006.01)
*H01L 23/04* (2006.01)

(52) U.S. Cl.
USPC ............ 174/534; 174/260; 361/762; 257/698

(58) Field of Classification Search
CPC ......... H05K 1/18; H05K 1/181; H05K 1/182; H05K 1/183; H05K 1/184; H05K 1/185; H05K 1/186
USPC .......... 174/266, 534, 260, 261; 361/761, 762, 361/763, 764; 257/698, 734
See application file for complete search history.

(56) References Cited

U.S. PATENT DOCUMENTS

| | | | |
|---|---|---|---|
| 2,596,993 A | 5/1952 | Gookin | |
| 3,435,815 A | 4/1969 | Forcier | |
| 3,734,660 A | 5/1973 | Davies et al. | |
| 3,838,984 A | 10/1974 | Crane et al. | |
| 3,868,724 A | 2/1975 | Perrino | |
| 3,916,434 A | 10/1975 | Garboushian | |
| 4,054,238 A | 10/1977 | Lloyd et al. | |
| 4,189,342 A | 2/1980 | Kock | |
| 4,258,381 A | 3/1981 | Inaba | |
| 4,289,922 A | 9/1981 | Devlin | |
| 4,301,464 A | 11/1981 | Otsuki et al. | |

(Continued)

FOREIGN PATENT DOCUMENTS

| | | |
|---|---|---|
| DE | 197 34 794 | 7/1998 |
| EP | 0 393 997 | 10/1990 |

(Continued)

OTHER PUBLICATIONS

IBM Technical Disclosure Bulletin, "Microstructure Solder Mask by Means of a Laser", vol. 36, Issue 11, p. 589, Nov. 1, 1993. (NN9311589).

(Continued)

*Primary Examiner* — Chau N Nguyen
*Assistant Examiner* — Roshn Varghese
(74) *Attorney, Agent, or Firm* — McAndrews, Held & Malloy, Ltd.

(57) ABSTRACT

A fan out build up substrate stackable package includes an electronic component having an active surface including a bond pad. A package body encloses the electronic component, the package body having a first surface coplanar with the active surface of the electronic component. A buildup dielectric layer is applied to the active surface of the electronic component and the first surface of the package body. A circuit pattern is formed within the first buildup dielectric layer and electrically connected to the bond pad, the first circuit pattern including via capture pads. Via capture pad apertures extend through the package body and expose the via capture pads. In this manner, direct connection to the first circuit pattern, i.e., the first metal layer, of the fan out build up substrate stackable package is facilitated. Further, the fan out build up substrate stackable package is extremely thin resulting in extremely thin stacked assemblies.

17 Claims, 12 Drawing Sheets

(56) References Cited

U.S. PATENT DOCUMENTS

| | | |
|---|---|---|
| 4,322,778 A | 3/1982 | Barbour et al. |
| 4,332,537 A | 6/1982 | Slepcevic |
| 4,417,266 A | 11/1983 | Grabbe |
| 4,451,224 A | 5/1984 | Harding |
| 4,530,152 A | 7/1985 | Roche et al. |
| 4,532,419 A | 7/1985 | Takeda |
| 4,541,003 A | 9/1985 | Otsuka et al. |
| 4,642,160 A | 2/1987 | Burgess |
| 4,645,552 A | 2/1987 | Vitriol et al. |
| 4,646,710 A | 3/1987 | Schmid et al. |
| 4,685,033 A | 8/1987 | Inoue |
| 4,706,167 A | 11/1987 | Sullivan |
| 4,707,724 A | 11/1987 | Suzuki et al. |
| 4,716,049 A | 12/1987 | Patraw |
| 4,727,633 A | 3/1988 | Herrick |
| 4,729,061 A | 3/1988 | Brown |
| 4,737,839 A | 4/1988 | Burt |
| 4,756,080 A | 7/1988 | Thorp, Jr. et al. |
| 4,786,952 A | 11/1988 | MacIver et al. |
| 4,806,188 A | 2/1989 | Rellick |
| 4,811,082 A | 3/1989 | Jacobs et al. |
| 4,812,896 A | 3/1989 | Rothgery et al. |
| 4,862,245 A | 8/1989 | Pashby et al. |
| 4,862,246 A | 8/1989 | Masuda et al. |
| 4,897,338 A | 1/1990 | Spicciati et al. |
| 4,905,124 A | 2/1990 | Banjo et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,964,212 A | 10/1990 | Deroux-Dauphin et al. |
| 4,974,120 A | 11/1990 | Kodai et al. |
| 4,987,475 A | 1/1991 | Schlesinger et al. |
| 4,996,391 A | 2/1991 | Schmidt |
| 5,018,003 A | 5/1991 | Yasunaga et al. |
| 5,021,047 A | 6/1991 | Movern |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,072,075 A | 12/1991 | Lee et al. |
| 5,072,520 A | 12/1991 | Nelson |
| 5,081,520 A | 1/1992 | Yoshii et al. |
| 5,087,961 A | 2/1992 | Long et al. |
| 5,091,341 A | 2/1992 | Asada et al. |
| 5,091,769 A | 2/1992 | Eichelberger |
| 5,096,852 A | 3/1992 | Hobson |
| 5,108,553 A | 4/1992 | Foster et al. |
| 5,110,664 A | 5/1992 | Nakanishi et al. |
| 5,118,298 A | 6/1992 | Murphy |
| 5,122,860 A | 6/1992 | Kikuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,191,174 A | 3/1993 | Chang et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,229,550 A | 7/1993 | Bindra et al. |
| 5,239,448 A | 8/1993 | Perkins et al. |
| 5,247,429 A | 9/1993 | Iwase et al. |
| 5,250,841 A | 10/1993 | Sloan et al. |
| 5,250,843 A | 10/1993 | Eichelberger |
| 5,252,853 A | 10/1993 | Michii |
| 5,258,094 A | 11/1993 | Furui et al. |
| 5,266,834 A | 11/1993 | Nishi et al. |
| 5,268,310 A | 12/1993 | Goodrich et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,278,726 A | 1/1994 | Bernardoni et al. |
| 5,279,029 A | 1/1994 | Burns |
| 5,281,849 A | 1/1994 | Singh Deo et al. |
| 5,283,459 A | 2/1994 | Hirano et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,353,498 A | 10/1994 | Fillion et al. |
| 5,358,905 A | 10/1994 | Chiu |
| 5,365,106 A | 11/1994 | Watanabe |
| 5,371,654 A | 12/1994 | Beaman et al. |
| 5,379,191 A | 1/1995 | Carey et al. |
| 5,381,042 A | 1/1995 | Lerner et al. |
| 5,391,439 A | 2/1995 | Tomita et al. |
| 5,394,303 A | 2/1995 | Yamaji |
| 5,404,044 A | 4/1995 | Booth et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | Lemaire et al. |
| 5,424,576 A | 6/1995 | Djennas et al. |
| 5,428,248 A | 6/1995 | Cha |
| 5,432,677 A | 7/1995 | Mowatt et al. |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,463,253 A | 10/1995 | Waki et al. |
| 5,474,957 A | 12/1995 | Urushima |
| 5,474,958 A | 12/1995 | Djennas et al. |
| 5,484,274 A | 1/1996 | Neu |
| 5,493,151 A | 2/1996 | Asada et al. |
| 5,497,033 A | 3/1996 | Fillion et al. |
| 5,508,556 A | 4/1996 | Lin |
| 5,508,938 A | 4/1996 | Wheeler |
| 5,517,056 A | 5/1996 | Bigler et al. |
| 5,521,429 A | 5/1996 | Aono et al. |
| 5,528,076 A | 6/1996 | Pavio |
| 5,530,288 A | 6/1996 | Stone |
| 5,531,020 A | 7/1996 | Durand et al. |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,546,654 A | 8/1996 | Wojnarowski et al. |
| 5,574,309 A | 11/1996 | Papapietro et al. |
| 5,576,517 A | 11/1996 | Wojnarowski et al. |
| 5,578,525 A | 11/1996 | Mizukoshi |
| 5,581,122 A | 12/1996 | Chao et al. |
| 5,581,498 A | 12/1996 | Ludwig et al. |
| 5,582,858 A | 12/1996 | Adamopoulos et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,616,422 A | 4/1997 | Ballard et al. |
| 5,619,068 A | 4/1997 | Benzoni |
| 5,625,222 A | 4/1997 | Yoneda et al. |
| 5,633,528 A | 5/1997 | Abbott et al. |
| 5,637,832 A | 6/1997 | Danner |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasarathi |

(56) References Cited

U.S. PATENT DOCUMENTS

| | | |
|---|---|---|
| 5,661,088 A | 8/1997 | Tessier et al. |
| 5,665,996 A | 9/1997 | Williams et al. |
| 5,673,479 A | 10/1997 | Hawthorne |
| 5,674,785 A | 10/1997 | Akram et al. |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,719,749 A | 2/1998 | Stopperan |
| 5,723,899 A | 3/1998 | Shin |
| 5,724,233 A | 3/1998 | Honda et al. |
| 5,726,493 A | 3/1998 | Yamashita et al. |
| 5,736,432 A | 4/1998 | Mackessy |
| 5,736,448 A | 4/1998 | Saia et al. |
| 5,739,581 A | 4/1998 | Chillara |
| 5,739,585 A | 4/1998 | Akram et al. |
| 5,739,588 A | 4/1998 | Ishida et al. |
| 5,742,479 A | 4/1998 | Asakura |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,769,989 A | 6/1998 | Hoffmeyer et al. |
| 5,770,888 A | 6/1998 | Song et al. |
| 5,774,340 A | 6/1998 | Chang et al. |
| 5,776,798 A | 7/1998 | Quan et al. |
| 5,783,861 A | 7/1998 | Son |
| 5,784,259 A | 7/1998 | Asakura |
| 5,786,238 A | 7/1998 | Pai et al. |
| 5,798,014 A | 8/1998 | Weber |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,822,190 A | 10/1998 | Iwasaki |
| 5,826,330 A | 10/1998 | Isoda et al. |
| 5,834,830 A | 11/1998 | Cho |
| 5,835,355 A | 11/1998 | Dordi |
| 5,835,988 A | 11/1998 | Ishii |
| 5,841,193 A | 11/1998 | Eichelberger |
| 5,844,306 A | 12/1998 | Fujita et al. |
| 5,847,453 A | 12/1998 | Uematsu et al. |
| 5,856,911 A | 1/1999 | Riley |
| 5,859,471 A | 1/1999 | Kuraishi et al. |
| 5,859,475 A | 1/1999 | Freyman et al. |
| 5,866,939 A | 2/1999 | Shin et al. |
| 5,871,782 A | 2/1999 | Choi |
| 5,874,770 A | 2/1999 | Saia et al. |
| 5,874,784 A | 2/1999 | Aoki et al. |
| 5,877,043 A | 3/1999 | Alcoe et al. |
| 5,883,425 A | 3/1999 | Kobayashi |
| 5,886,397 A | 3/1999 | Ewer |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,903,052 A | 5/1999 | Chen et al. |
| 5,907,477 A | 5/1999 | Tuttle et al. |
| 5,909,053 A | 6/1999 | Fukase et al. |
| 5,915,998 A | 6/1999 | Stidham et al. |
| 5,917,242 A | 6/1999 | Ball |
| 5,936,843 A | 8/1999 | Ohshima et al. |
| 5,937,324 A | 8/1999 | Abercrombie et al. |
| 5,939,779 A | 8/1999 | Kim |
| 5,942,794 A | 8/1999 | Okumura et al. |
| 5,951,305 A | 9/1999 | Haba |
| 5,952,611 A | 9/1999 | Eng et al. |
| 5,959,356 A | 9/1999 | Oh |
| 5,969,426 A | 10/1999 | Baba et al. |
| 5,973,388 A | 10/1999 | Chew et al. |
| 5,973,393 A * | 10/1999 | Chia et al. ................... 257/690 |
| 5,976,912 A | 11/1999 | Fukutomi et al. |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |
| 5,982,632 A | 11/1999 | Mosley et al. |
| 5,986,333 A | 11/1999 | Nakamura |
| 5,986,885 A | 11/1999 | Wyland |
| 6,001,671 A | 12/1999 | Fjelstad |
| 6,004,619 A | 12/1999 | Dippon et al. |
| 6,013,947 A | 1/2000 | Lim |
| 6,013,948 A | 1/2000 | Akram et al. |
| 6,018,189 A | 1/2000 | Mizuno |
| 6,020,625 A | 2/2000 | Qin et al. |
| 6,021,564 A | 2/2000 | Hanson |
| 6,025,640 A | 2/2000 | Yagi et al. |
| 6,028,364 A | 2/2000 | Ogino et al. |
| 6,031,279 A | 2/2000 | Lenz |
| RE36,613 E | 3/2000 | Ball |
| 6,034,423 A | 3/2000 | Mostafazadeh et al. |
| 6,034,427 A | 3/2000 | Lan et al. |
| 6,035,527 A | 3/2000 | Tamm |
| 6,040,622 A | 3/2000 | Wallace |
| 6,040,626 A | 3/2000 | Cheah et al. |
| 6,043,430 A | 3/2000 | Chun |
| 6,060,768 A | 5/2000 | Hayashida et al. |
| 6,060,769 A | 5/2000 | Wark |
| 6,060,778 A | 5/2000 | Jeong et al. |
| 6,069,407 A | 5/2000 | Hamzehdoost |
| 6,072,228 A | 6/2000 | Hinkle et al. |
| 6,072,243 A | 6/2000 | Nakanishi |
| 6,075,284 A | 6/2000 | Choi et al. |
| 6,081,029 A | 6/2000 | Yamaguchi |
| 6,081,036 A | 6/2000 | Hirano et al. |
| 6,084,310 A | 7/2000 | Mizuno et al. |
| 6,087,715 A | 7/2000 | Sawada et al. |
| 6,087,722 A | 7/2000 | Lee et al. |
| 6,100,594 A | 8/2000 | Fukui et al. |
| 6,113,474 A | 9/2000 | Shih et al. |
| 6,114,752 A | 9/2000 | Huang et al. |
| 6,118,174 A | 9/2000 | Kim |
| 6,118,184 A | 9/2000 | Ishio et al. |
| 6,119,338 A | 9/2000 | Wang et al. |
| 6,122,171 A | 9/2000 | Akram et al. |
| RE36,907 E | 10/2000 | Templeton, Jr. et al. |
| 6,127,833 A | 10/2000 | Wu et al. |
| 6,130,115 A | 10/2000 | Okumura et al. |
| 6,130,473 A | 10/2000 | Mostafazadeh et al. |
| 6,133,623 A | 10/2000 | Otsuki et al. |
| 6,140,154 A | 10/2000 | Hinkle et al. |
| 6,143,981 A | 11/2000 | Glenn |
| 6,160,705 A | 12/2000 | Stearns et al. |
| 6,169,329 B1 | 1/2001 | Farnworth et al. |
| 6,172,419 B1 | 1/2001 | Kinsman |
| 6,175,087 B1 | 1/2001 | Keesler et al. |
| 6,177,718 B1 | 1/2001 | Kozono |
| 6,181,002 B1 | 1/2001 | Juso et al. |
| 6,184,463 B1 | 2/2001 | Panchou et al. |
| 6,184,465 B1 | 2/2001 | Corisis |
| 6,184,573 B1 | 2/2001 | Pu |
| 6,194,250 B1 | 2/2001 | Melton et al. |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,453 B1 | 3/2001 | Fallon et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,214,525 B1 | 4/2001 | Boyko et al. |
| 6,214,641 B1 | 4/2001 | Akram |

(56) References Cited

U.S. PATENT DOCUMENTS

| | | |
|---|---|---|
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | Mclellan et al. |
| 6,229,205 B1 | 5/2001 | Jeong et al. |
| 6,235,554 B1 | 5/2001 | Akram et al. |
| 6,239,367 B1 | 5/2001 | Hsuan et al. |
| 6,239,384 B1 | 5/2001 | Smith et al. |
| 6,239,485 B1 | 5/2001 | Peters et al. |
| 6,242,281 B1 | 6/2001 | Mclellan et al. |
| D445,096 S | 7/2001 | Wallace |
| 6,256,200 B1 | 7/2001 | Lam et al. |
| 6,258,192 B1 | 7/2001 | Natarajan |
| 6,258,629 B1 | 7/2001 | Niones et al. |
| 6,261,918 B1 | 7/2001 | So |
| D446,525 S | 8/2001 | Okamoto et al. |
| 6,274,821 B1 | 8/2001 | Echigo et al. |
| 6,280,641 B1 | 8/2001 | Gaku et al. |
| 6,281,566 B1 | 8/2001 | Magni |
| 6,281,568 B1 | 8/2001 | Glenn et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,285 B1 | 11/2001 | Jiang et al. |
| 6,316,822 B1 | 11/2001 | Venkateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karnezos et al. |
| 6,335,564 B1 | 1/2002 | Pour |
| 6,337,510 B1 | 1/2002 | Chun-Jen et al. |
| 6,339,255 B1 | 1/2002 | Shin |
| 6,348,726 B1 | 2/2002 | Bayan et al. |
| 6,351,031 B1 | 2/2002 | Iijima et al. |
| 6,353,999 B1 | 3/2002 | Cheng |
| 6,355,502 B1 | 3/2002 | Kang et al. |
| 6,365,974 B1 | 4/2002 | Abbott et al. |
| 6,365,975 B1 | 4/2002 | DiStefano et al. |
| 6,369,447 B2 | 4/2002 | Mori |
| 6,369,454 B1 | 4/2002 | Chung |
| 6,373,127 B1 | 4/2002 | Baudouin et al. |
| 6,376,906 B1 | 4/2002 | Asai et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,392,160 B1 | 5/2002 | Andry et al. |
| 6,395,578 B1 | 5/2002 | Shin et al. |
| 6,396,148 B1 | 5/2002 | Eichelberger et al. |
| 6,396,153 B2 | 5/2002 | Fillion et al. |
| 6,400,004 B1 | 6/2002 | Fan et al. |
| 6,405,431 B1 | 6/2002 | Shin et al. |
| 6,406,942 B2 | 6/2002 | Honda |
| 6,407,341 B1 | 6/2002 | Anstrom et al. |
| 6,407,930 B1 | 6/2002 | Hsu |
| 6,410,979 B2 | 6/2002 | Abe |
| 6,414,385 B1 | 7/2002 | Huang et al. |
| 6,420,779 B1 | 7/2002 | Sharma et al. |
| 6,429,508 B1 | 8/2002 | Gang |
| 6,437,429 B1 | 8/2002 | Su et al. |
| 6,444,499 B1 | 9/2002 | Swiss et al. |
| 6,448,510 B1 | 9/2002 | Neftin et al. |
| 6,448,633 B1 | 9/2002 | Yee et al. |
| 6,451,509 B2 | 9/2002 | Keesler et al. |
| 6,452,279 B2 | 9/2002 | Shimoda |
| 6,459,148 B1 | 10/2002 | Chun-Jen et al. |
| 6,464,121 B2 | 10/2002 | Reijnders |
| 6,476,469 B2 | 11/2002 | Hung et al. |
| 6,476,474 B1 | 11/2002 | Hung |
| 6,479,762 B2 | 11/2002 | Kusaka |
| 6,482,680 B1 | 11/2002 | Khor et al. |
| 6,497,943 B1 | 12/2002 | Jimarez et al. |
| 6,498,099 B1 | 12/2002 | McLellan et al. |
| 6,498,392 B2 | 12/2002 | Azuma |
| 6,507,096 B2 | 1/2003 | Gang |
| 6,507,120 B2 | 1/2003 | Lo et al. |
| 6,517,995 B1 | 2/2003 | Jacobson et al. |
| 6,521,530 B2 | 2/2003 | Peters et al. |
| 6,524,885 B2 | 2/2003 | Pierce |
| 6,534,391 B1 | 3/2003 | Huemoeller et al. |
| 6,534,849 B1 | 3/2003 | Gang |
| 6,544,638 B2 | 4/2003 | Fischer et al. |
| 6,545,332 B2 | 4/2003 | Huang |
| 6,545,345 B1 | 4/2003 | Glenn et al. |
| 6,559,525 B2 | 5/2003 | Huang |
| 6,566,168 B2 | 5/2003 | Gang |
| 6,583,503 B2 | 6/2003 | Akram et al. |
| 6,586,682 B2 | 7/2003 | Strandberg |
| 6,593,645 B2 | 7/2003 | Shih et al. |
| 6,603,196 B2 | 8/2003 | Lee et al. |
| 6,608,757 B1 | 8/2003 | Bhatt et al. |
| 6,624,005 B1 | 9/2003 | DiCaprio et al. |
| 6,660,559 B1 | 12/2003 | Huemoeller et al. |
| 6,667,546 B2 | 12/2003 | Huang et al. |
| 6,671,398 B2 | 12/2003 | Reinhorn et al. |
| 6,705,512 B2 * | 3/2004 | Ho et al. .................. 257/E23.02 |
| 6,715,204 B1 | 4/2004 | Tsukada et al. |
| 6,727,576 B2 | 4/2004 | Hedler et al. |
| 6,727,645 B2 | 4/2004 | Tsujimura et al. |
| 6,730,857 B2 | 5/2004 | Konrad et al. |
| 6,734,542 B2 | 5/2004 | Nakatani et al. |
| 6,740,964 B2 | 5/2004 | Sasaki |
| 6,753,612 B2 | 6/2004 | Adae-Amoakoh et al. |
| 6,759,272 B2 * | 7/2004 | Tsubosaki et al. ............. 438/109 |
| 6,774,748 B1 | 8/2004 | Ito et al. |
| 6,787,443 B1 | 9/2004 | Boggs et al. |
| 6,803,528 B1 | 10/2004 | Koyanagi |
| 6,815,709 B2 | 11/2004 | Clothier et al. |
| 6,815,739 B2 | 11/2004 | Huff et al. |
| 6,831,371 B1 | 12/2004 | Huemoeller et al. |
| 6,838,776 B2 | 1/2005 | Leal et al. |
| 6,845,554 B2 | 1/2005 | Frankowsky et al. |
| 6,888,240 B2 | 5/2005 | Towle et al. |
| 6,905,914 B1 | 6/2005 | Huemoeller et al. |
| 6,919,514 B2 | 7/2005 | Konrad et al. |
| 6,921,968 B2 | 7/2005 | Chung |
| 6,921,975 B2 | 7/2005 | Leal et al. |
| 6,930,256 B1 | 8/2005 | Huemoeller et al. |
| 6,931,726 B2 | 8/2005 | Boyko et al. |
| 6,953,995 B2 | 10/2005 | Farnworth et al. |
| 7,015,075 B2 | 3/2006 | Fay et al. |
| 7,030,469 B2 | 4/2006 | Mahadevan et al. |
| 7,041,534 B2 | 5/2006 | Chao et al. |
| 7,057,290 B2 * | 6/2006 | Sunohara et al. .............. 257/777 |
| 7,081,661 B2 | 7/2006 | Takehara et al. |
| 7,125,744 B2 | 10/2006 | Takehara et al. |
| 7,129,158 B2 | 10/2006 | Nakai |
| 7,185,426 B1 | 3/2007 | Hiner et al. |
| 7,190,062 B1 | 3/2007 | Sheridan et al. |
| 7,192,807 B1 | 3/2007 | Huemoeller et al. |
| 7,198,980 B2 | 4/2007 | Jiang et al. |
| 7,242,081 B1 | 7/2007 | Lee |
| 7,247,523 B1 | 7/2007 | Huemoeller et al. |
| 7,272,444 B2 | 9/2007 | Peterson et al. |
| 7,282,394 B2 | 10/2007 | Cho et al. |
| 7,285,855 B2 | 10/2007 | Foong |
| 7,321,164 B2 * | 1/2008 | Hsu ............................... 257/686 |
| 7,345,361 B2 | 3/2008 | Mallik et al. |
| 7,361,533 B1 | 4/2008 | Huemoeller et al. |
| 7,372,151 B1 | 5/2008 | Fan et al. |
| 7,420,272 B1 | 9/2008 | Huemoeller et al. |
| 7,429,786 B2 | 9/2008 | Karnezos et al. |
| 7,459,202 B2 | 12/2008 | Magera et al. |
| 7,548,430 B1 | 6/2009 | Huemoeller et al. |

(56) References Cited

U.S. PATENT DOCUMENTS

| | | |
|---|---|---|
| 7,550,857 B1 | 6/2009 | Longo et al. |
| 7,572,681 B1 | 8/2009 | Huemoeller et al. |
| 7,807,512 B2 | 10/2010 | Lee et al. |
| 2001/0008305 A1 | 7/2001 | McLellan et al. |
| 2001/0011654 A1 | 8/2001 | Schmidt et al. |
| 2001/0012704 A1 | 8/2001 | Eldridge |
| 2001/0014538 A1 | 8/2001 | Kwan et al. |
| 2002/0017712 A1 | 2/2002 | Bessho et al. |
| 2002/0024122 A1 | 2/2002 | Jung et al. |
| 2002/0027297 A1 | 3/2002 | Ikenaga et al. |
| 2002/0061642 A1 | 5/2002 | Haji et al. |
| 2002/0066952 A1 | 6/2002 | Taniguchi et al. |
| 2002/0140061 A1 | 10/2002 | Lee |
| 2002/0140068 A1 | 10/2002 | Lee et al. |
| 2002/0163015 A1 | 11/2002 | Lee et al. |
| 2002/0163075 A1* | 11/2002 | Ho et al. .................. 257/712 |
| 2002/0195697 A1 | 12/2002 | Mess et al. |
| 2003/0013232 A1 | 1/2003 | Towle et al. |
| 2003/0025199 A1 | 2/2003 | Wu et al. |
| 2003/0030131 A1 | 2/2003 | Lee et al. |
| 2003/0064548 A1 | 4/2003 | Isaak |
| 2003/0073265 A1 | 4/2003 | Hu et al. |
| 2003/0128096 A1 | 7/2003 | Mazzochette |
| 2003/0134451 A1* | 7/2003 | Chen ........................ 438/109 |
| 2003/0134455 A1 | 7/2003 | Cheng et al. |
| 2003/0141582 A1 | 7/2003 | Yang et al. |
| 2003/0197284 A1 | 10/2003 | Khiang et al. |
| 2004/0004293 A1 | 1/2004 | Murayama |
| 2004/0026781 A1 | 2/2004 | Nakai |
| 2004/0046244 A1 | 3/2004 | Nakamura et al. |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0063246 A1 | 4/2004 | Karnezos |
| 2004/0113260 A1 | 6/2004 | Sunohara et al. |
| 2004/0145044 A1 | 7/2004 | Sugaya et al. |
| 2004/0159462 A1 | 8/2004 | Chung |
| 2004/0159933 A1* | 8/2004 | Sunohara et al. ........ 257/700 |
| 2004/0188136 A1* | 9/2004 | Sunohara et al. ........ 174/255 |
| 2005/0029644 A1* | 2/2005 | Ho et al. .................. 257/686 |
| 2005/0139985 A1 | 6/2005 | Takahashi |
| 2005/0184377 A1* | 8/2005 | Takeuchi et al. ........ 257/686 |
| 2005/0242425 A1 | 11/2005 | Leal et al. |
| 2005/0282314 A1 | 12/2005 | Lo et al. |
| 2006/0124347 A1* | 6/2006 | Takaike .................... 174/254 |
| 2006/0208356 A1* | 9/2006 | Yamano et al. .......... 257/734 |
| 2007/0056766 A1* | 3/2007 | Sunohara .................. 174/260 |
| 2007/0084628 A1* | 4/2007 | Chang et al. ............. 174/260 |
| 2007/0222062 A1* | 9/2007 | Sunohara et al. ........ 257/700 |
| 2007/0273049 A1 | 11/2007 | Khan et al. |
| 2007/0281471 A1 | 12/2007 | Hurwitz et al. |
| 2007/0290376 A1 | 12/2007 | Zhao et al. |
| 2008/0067666 A1* | 3/2008 | Hsu ........................... 438/106 |
| 2008/0106879 A1* | 5/2008 | Ryu et al. ................. 361/783 |
| 2008/0157336 A1* | 7/2008 | Yang ......................... 257/690 |
| 2008/0230887 A1 | 9/2008 | Sun et al. |
| 2009/0152715 A1* | 6/2009 | Shim et al. ............... 257/737 |

FOREIGN PATENT DOCUMENTS

| | | |
|---|---|---|
| EP | 0 459 493 | 12/1991 |
| EP | 0 720 225 | 7/1996 |
| EP | 0 720 234 | 7/1996 |
| EP | 0 794 572 | 9/1997 |
| EP | 0 844 665 | 5/1998 |
| EP | 0 936 671 | 8/1999 |
| EP | 0 989 608 | 3/2000 |
| EP | 1 032 037 | 8/2000 |
| JP | 55-163868 | 12/1980 |
| JP | 57-045959 | 3/1982 |
| JP | 59-208756 | 11/1984 |
| JP | 59-227143 | 12/1984 |
| JP | 60-010756 | 1/1985 |
| JP | 60-116239 | 6/1985 |
| JP | 60-195957 | 10/1985 |
| JP | 60-231349 | 11/1985 |
| JP | 61-039555 | 2/1986 |
| JP | 62-009639 | 1/1987 |
| JP | 63-033854 | 2/1988 |
| JP | 63-067762 | 3/1988 |
| JP | 63-188964 | 8/1988 |
| JP | 63-205935 | 8/1988 |
| JP | 63-233555 | 9/1988 |
| JP | 63-249345 | 10/1988 |
| JP | 63-289951 | 11/1988 |
| JP | 63-316470 | 12/1988 |
| JP | 64-054749 | 3/1989 |
| JP | 01-106456 | 4/1989 |
| JP | 01-175250 | 7/1989 |
| JP | 01-205544 | 8/1989 |
| JP | 01-251747 | 10/1989 |
| JP | 02-129948 | 5/1990 |
| JP | 03-069248 | 7/1991 |
| JP | 03-177060 | 8/1991 |
| JP | 04-098864 | 3/1992 |
| JP | 05-109975 | 4/1993 |
| JP | 05-129473 | 5/1993 |
| JP | 05-136323 | 6/1993 |
| JP | 05-166992 | 7/1993 |
| JP | 05-283460 | 10/1993 |
| JP | 06-092076 | 4/1994 |
| JP | 06-140563 | 5/1994 |
| JP | 06-260532 | 9/1994 |
| JP | 07-017175 | 1/1995 |
| JP | 07-297344 | 11/1995 |
| JP | 07-312405 | 11/1995 |
| JP | 08-064634 | 3/1996 |
| JP | 08-083877 | 3/1996 |
| JP | 08-125066 | 5/1996 |
| JP | 08-190615 | 7/1996 |
| JP | 08-222682 | 8/1996 |
| JP | 08-306853 | 11/1996 |
| JP | 09-008205 | 1/1997 |
| JP | 09-008206 | 1/1997 |
| JP | 09-008207 | 1/1997 |
| JP | 09-092775 | 4/1997 |
| JP | 09-293822 | 11/1997 |
| JP | 10-022447 | 1/1998 |
| JP | 10-163401 | 6/1998 |
| JP | 10-199934 | 7/1998 |
| JP | 10-256240 | 9/1998 |
| JP | 10-334205 | 12/1998 |
| JP | 2000-150765 | 5/2000 |
| JP | 2000-556398 | 10/2000 |
| JP | 2001-060648 | 3/2001 |
| JP | 2002-043497 | 2/2002 |
| KR | 1994-0001979 | 1/1994 |
| KR | 10-0220154 | 6/1999 |
| KR | 2002-0049944 | 6/2002 |
| WO | WO 99/56316 | 11/1999 |
| WO | WO 99/67821 | 12/1999 |

OTHER PUBLICATIONS

Kim et al., "Application of Through Mold Via (TMV) as PoP base package", 58$^{th}$ ECTC Proceedings, May 2008, Lake Buena Vista, FL, 6 pages, IEEE.

Scanlan, "Package-on-package (PoP) with Through-mold Vias", Advanced Packaging, Jan. 2008, 3 pages, vol. 17, Issue 1, PennWell Corporation.

Huemoeller et al., "Integrated Circuit Film Substrate Having Embedded Conductive Patterns and Vias", U.S. Appl. No. 10/261,868, filed Oct. 1, 2002.

Hiner et al., "Printed Wiring Motherboard Having Bonded Interconnect Redistribution Mesa", U.S. Appl. No. 10/992,371, filed Nov. 18, 2004.

Berry et al., "Direct-Write Wafer Level Chip Scale Package", U.S. Appl. No. 11/289,826, filed Nov. 29, 2005.

Scanlan et al., "Semiconductor Package Including a Top-Surface Metal Layer for Implementing Circuit Features", U.S. Appl. No. 11/293,999, filed Dec. 5, 2005.

(56) References Cited

OTHER PUBLICATIONS

Lee et al., "Substrate for Semiconductor Device and Manufacturing Method Thereof", U.S. Appl. No. 11/440,548, filed May 24, 2006.

Hiner et al., "Semiconductor Package Including Top-Surface Terminals for Mounting Another Semiconductor Package", U.S. Appl. No. 11/595,411, filed Nov. 9, 2006.

Huemoeller et al., "Electronic Component Package Comprising Fan-out and Fan-in Traces", U.S. Appl. No. 11/605,740, filed Nov. 28, 2006.

Berry et al., "Direct-write Wafer Level Chip Scale Package", U.S. Appl. No. 11/810,799, filed Jun. 6, 2007.

Huemoeller et al., "Build Up Motherboard Fabrication Method and Structure", U.S. Appl. No. 11/824,395, filed Jun. 29, 2007.

Berry et al., "Thin Stacked Interposer Package", U.S. Appl. No. 11/865,617, filed Oct. 1, 2007.

Huemoeller et al., "Two-sided Fan-out Wafer Escape Package", U.S. Appl. No. 12/221,797, filed Aug. 5, 2008.

Longo et al., "Stacked Redistribution Layer (RDL) Die Assembly Package", U.S. Appl. No. 12/387,672, filed May 5, 2009.

Huemoeller et al., "Buildup Dielectric Layer Having Metallization Pattern Semiconductor Package Fabrication Method", U.S. Appl. No. 12/387,691, filed May 5, 2009.

Miller Jr. et al., "Thermal Via Heat Spreader Package and Method", U.S. Appl. No. 12/421,118, filed Apr. 9, 2009.

Huemoeller et al., "Embedded Electronic Component Package Fabrication Method", U.S. Appl. No. 12/459,532, filed Jul. 2, 2009.

Scanlan et al., "Semiconductor Package Including a Top-Surface Metal Layer for Implementing Circuit Features", U.S. Appl. No. 12/589,839, filed Oct. 28, 2009.

Dunlap et al., "Thin Stackable Package and Method", U.S. Appl. No. 12/630,586, filed Dec. 3, 2009.

\* cited by examiner

FAN OUT BUILD UP SUBSTRATE STACKABLE PACKAGE AND METHOD

BACKGROUND OF THE INVENTION

1. Field of the Invention

The present application relates to the field of electronics, and more particularly, to methods of forming electronic component packages and related structures.

2. Description of the Related Art

To reduce the size of electronic devices such as cell phones, it is desirable to minimize the thickness of electronic component packages used within the electronic devices as well as the mounting area required to mount the electronic component packages. Often, electronic component packages are stacked one upon another to reduce the mounting area required for the electronic component packages as compared to mounting the electronic component packages in a side by side arrangement. Unfortunately, stacking the electronic component packages results in an undesirable increased thickness as compared to mounting the electronic component packages in a side by side arrangement.

SUMMARY OF THE INVENTION

A fan out build up substrate stackable package includes an electronic component having an active surface including a bond pad. A package body encloses the electronic component, the package body having a first surface coplanar with the active surface of the electronic component. A buildup dielectric layer is applied to the active surface of the electronic component and the first surface of the package body. A circuit pattern is formed within the first buildup dielectric layer and electrically connected to the bond pad, the first circuit pattern including via capture pads. Via capture pad apertures extend through the package body and expose the via capture pads.

In this manner, direct connection to the first circuit pattern, i.e., the first metal layer, of the fan out build up substrate stackable package is facilitated. Further, the fan out build up substrate stackable package is extremely thin resulting in extremely thin stacked assemblies.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
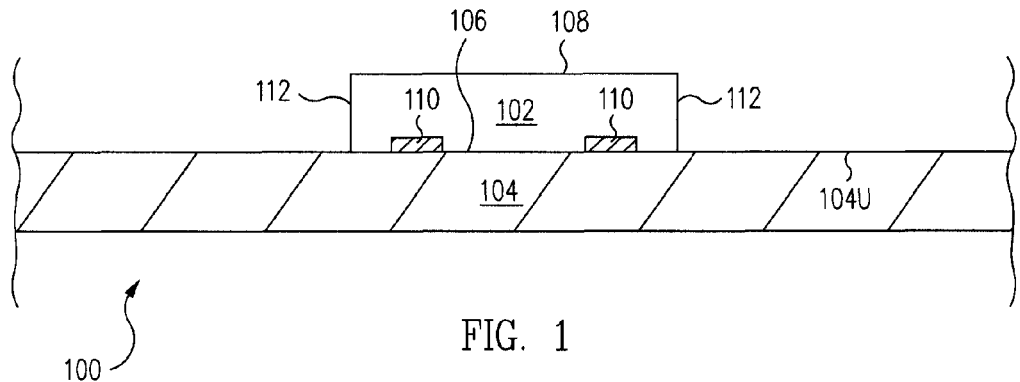
FIG. 1 is a cross-sectional view of a fan out build up substrate stackable package during fabrication in accordance with one embodiment.

FIG. 1 is a cross-sectional view of a fan out build up substrate stackable package 100 during fabrication in accordance with one embodiment. Referring now to FIG. 1, an electronic component 102 is mounted to a carrier 104.

In one embodiment, electronic component 102 is an integrated circuit chip, e.g., an active component. However, in other embodiments, electronic component 102 is a passive component such as a capacitor, resistor, or inductor.

In accordance with this embodiment, electronic component 102 includes an active surface 106 and an opposite inactive surface 108. Electronic component 102 further includes bond pads 110 formed on active surface 106 and sides 112 extending between active surface 106 and inactive surface 108.

In one embodiment, carrier 104 includes an adhesive on an upper, e.g., first, surface 104U of carrier 104. Active surface 106 of electronic component 102 is pressed into upper surface 104U of carrier 104 and thus sticks to carrier 104. However, in other embodiments, an adhesive is applied to active surface 106 of electronic component 102, and this adhesive is pressed into carrier 104 to stick electronic component 102 to carrier 104.

Figure 2:
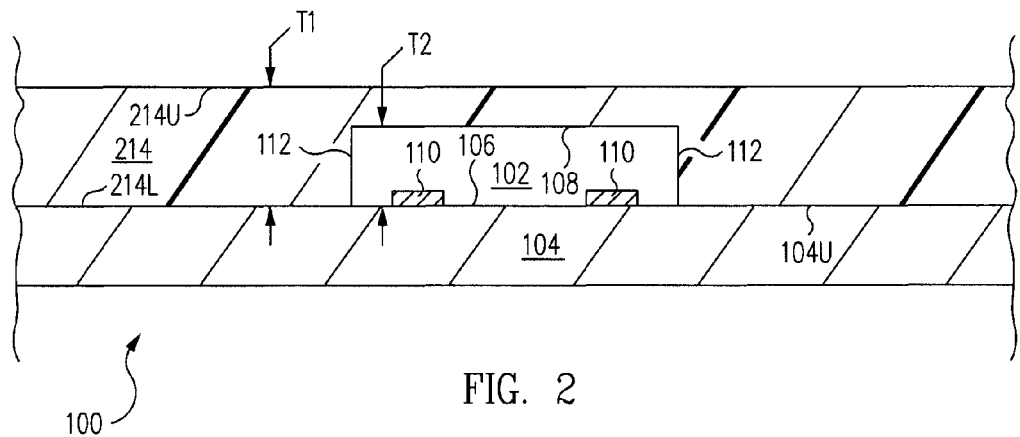
FIGS. 2, 3, 4, 5, 6, 7 are cross-sectional views of the fan out build up substrate stackable package of FIG. 1 at later stages during fabrication in accordance with various embodiments.

FIG. 2 is a cross-sectional view of fan out build up substrate stackable package 100 of FIG. 1 at a later stage during fabrication in accordance with one embodiment. Referring now to FIG. 2, electronic component 102 is encapsulated in a dielectric package body 214.

Illustratively, electronic component 102 and carrier 104 are placed into a mold and mold compound is injected into the mold and around electronic component 102. This mold compound hardens to form package body 214. Thus, in accordance with this embodiment, package body 214 is formed of mold compound. However, in other embodiments, package body 214 is formed of other dielectric materials such as hardened liquid encapsulant.

Package body 214 includes a lower, e.g., first, surface 214L attached to upper surface 104U of carrier 104 and an upper, e.g., second, surface 214U. Package body 214 completely encloses electronic component 102 including inactive surface 108 and sides 112 and the exposed portion of upper surface 104U of carrier 104.

Package body 214 is thicker having a thickness T1 greater than a thickness T2 of electronic component 102. More particularly, upper surface 214U is above and spaced apart from inactive surface 108.

Figure 3:
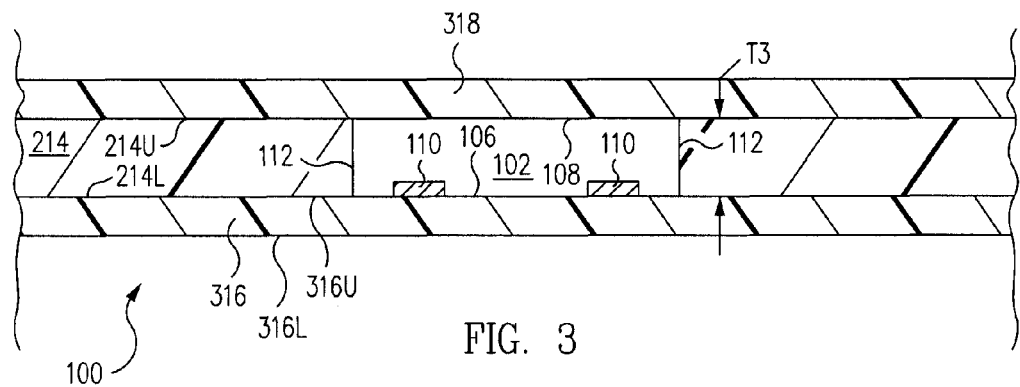

FIG. 3 is a cross-sectional view of fan out build up substrate stackable package 100 of FIG. 2 at a later stage during fabrication in accordance with one embodiment. Referring now to FIGS. 2 and 3 together, package body 214 is ground down from upper surface 214U to expose inactive surface 108 of electronic component 102. In one embodiment, inactive surface 108 is also ground down thus thinning both package body 214 and electronic component 102. After thinning, upper surface 214U of package body 214 and inactive surface 108 of electronic component 102 are parallel and coplanar. Although various features may be described as being parallel, coplanar, perpendicular, or having other relationships, in light of this disclosure, those of skill in the art will understand that the features may not be exactly parallel, coplanar, perpendicular, but only substantially parallel, coplanar, perpendicular to within accepted manufacturing tolerances.

Further, after grinding, package body 214 and electronic component 102 have an equal thickness T3 less than thicknesses T1, T2 prior to grinding. Thinning package body 214 and electronic component 102 minimizes the overall thickness of fan out build up substrate stackable package 100. Generally, fan out build up substrate stackable package 100 is extremely thin resulting in extremely thin stacked assemblies. Grinding of package body 214 and electronic component 102 is optional, and in one embodiment, is not performed.

Referring now to FIGS. 2 and 3 together, package body 214 is a relatively rigid material allowing carrier 104 (FIG. 2) to be removed as illustrated in FIG. 3. In various embodiments, carrier 104 is removed by peeling, etching, grinding, or other removal technique.

Referring now to FIG. 3, a first buildup dielectric layer 316 is applied to lower surface 214L of package body 214 and active surface 106 of electronic component 102 including bond pads 110. More particularly, an upper, e.g., first, surface 316U is applied to lower surface 214L of package body 214 and active surface 106 of electronic component 102. First buildup dielectric layer 316 further includes a lower, e.g., second, surface 316L.

Optionally, a dielectric backside warpage control layer 318 is applied to upper surface 214U of package body 214. In the case where inactive surface 108 of electronic component 102 is exposed, backside warpage control layer 318 is also applied to inactive surface 108.

Backside warpage control layer 318 has a thermal coefficient of expansion similar or identical to first buildup dielectric layer 316. More particularly, backside warpage control layer 318 expands and contracts at various temperatures in a similar manner to first buildup dielectric layer 316. Accordingly, backside warpage control layer 318 offsets stress and associated warpage generated by thermal expansion and contraction of first buildup dielectric layer 316. In this manner, backside warpage control layer 318 prevents warpage of fan out build up substrate stackable package 100. However, formation of backside warpage control layer 318 is optional, and in one embodiment, backside warpage control layer 318 is not formed.

Figure 4:
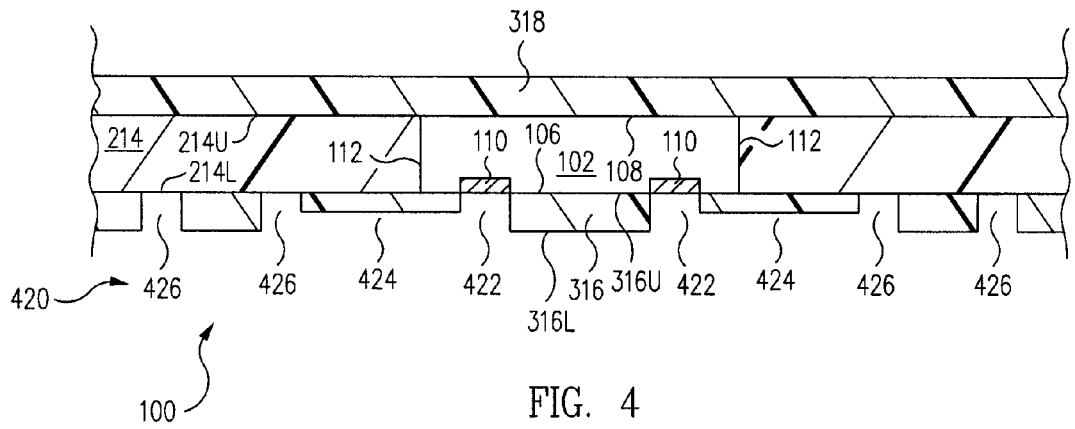

FIG. 4 is a cross-sectional view of fan out build up substrate stackable package 100 of FIG. 3 at a later stage during fabrication in accordance with one embodiment. Referring now to FIG. 4, a circuit pattern artifact 420 is formed in first buildup dielectric layer 316. Circuit pattern artifact 420 is formed using laser ablation, selective etching, or other technique.

Circuit pattern artifact 420 is a positive image of the circuit pattern to be formed in first buildup dielectric layer 316. Circuit pattern artifact 420 includes bond pad via apertures 422 extending entirely through first buildup dielectric layer 316 and exposing bond pads 110. Circuit pattern artifact 420 further includes trace channels 424 and via capture pad openings 426.

Figure 5:
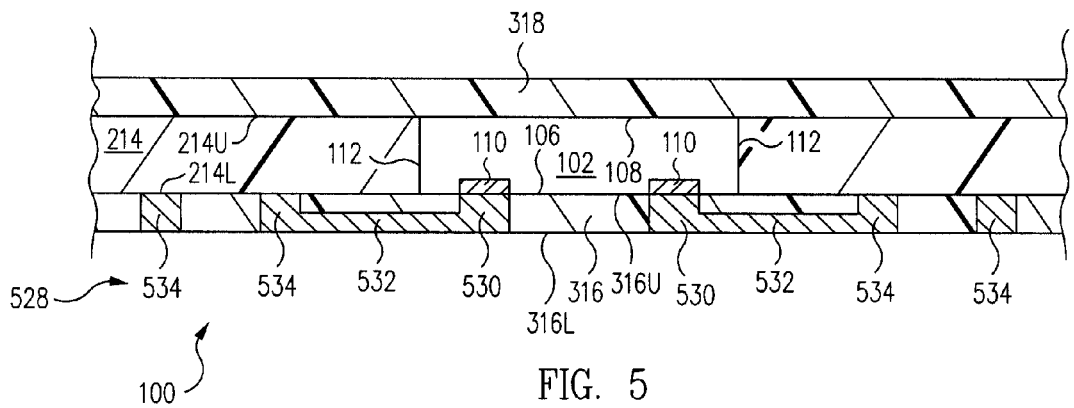

FIG. 5 is a cross-sectional view of fan out build up substrate stackable package 100 of FIG. 4 at a later stage during fabrication in accordance with one embodiment. Referring now to FIGS. 4 and 5 together, a circuit pattern 528, sometimes called a first circuit pattern, is formed within circuit pattern artifact 420. In one embodiment, circuit pattern 528, sometimes called a first metal layer, is formed by plating an electrically conductive material such as copper within circuit pattern artifact 420. Generally, circuit pattern 528 is formed within first buildup dielectric layer 316.

In one embodiment, circuit pattern 528 includes one or more metal layers. For example, initially a solder wettable layer such as gold is plated in circuit pattern artifact 420 to partially fill circuit pattern artifact 420. Circuit pattern artifact 420 is then completely filled with a second metal such as copper. In this manner, the exposed surfaces of via capture pads of circuit pattern 528 are solder wettable as discussed in greater detail below.

Circuit pattern 528 includes electrically conductive bond pad vias 530 formed in bond pad via apertures 422 and electrically connected to bond pads 110. Circuit pattern 528 further includes electrically conductive traces 532 formed within trace channels 424 and electrically conductive via capture pads 534 formed within via capture pad openings 426. Although circuit pattern 528 is set forth as containing particular features, e.g., bond pad vias 530, traces 532, and via capture pads 534, in light of this disclosure, those of skill in the art will understand that a circuit pattern can be formed with other and/or different features depending on the particular signal routing desired. Further, instead of being embedded inside of first buildup dielectric layer 316, in another embodiment, traces 532 are formed on lower surface 316L of first buildup dielectric layer 316.

Figure 6:
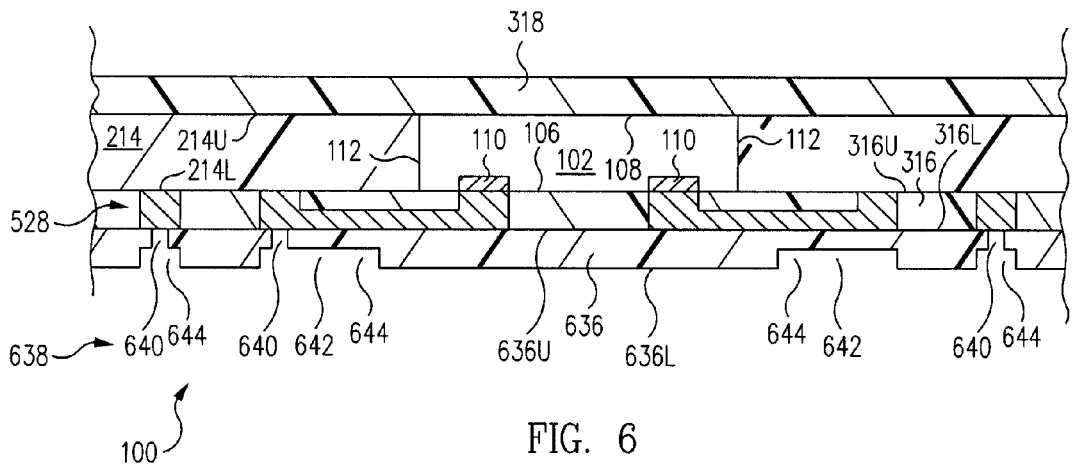

FIG. 6 is a cross-sectional view of fan out build up substrate stackable package 100 of FIG. 5 at a later stage during fabrication in accordance with one embodiment. Referring now to FIG. 6, an upper, e.g., first, surface 636U of a second buildup dielectric layer 636 is applied to lower surface 316L of first buildup dielectric layer 316 and to circuit pattern 528.

A circuit pattern artifact 638 is formed in a lower, e.g., second, surface 636L of second buildup dielectric layer 636. Circuit pattern artifact 638 is formed using laser ablation, selective etching, or other technique.

Circuit pattern artifact 638 is a positive image of the circuit pattern to be formed in second buildup dielectric layer 636. Circuit pattern artifact 638 includes blind via apertures 640 extending entirely through second buildup dielectric layer 636 and exposing circuit pattern 528. Circuit pattern artifact 638 further includes trace channels 642 and land openings 644.

Figure 7:
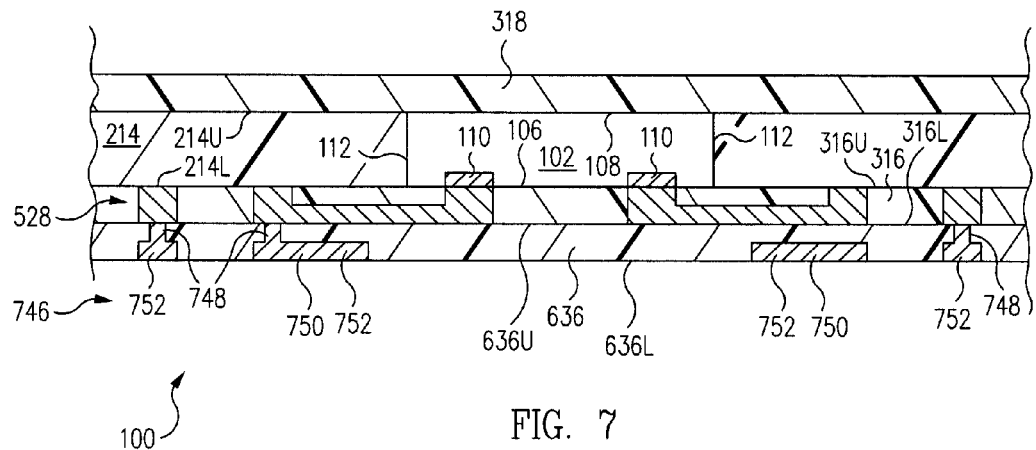

FIG. 7 is a cross-sectional view of fan out build up substrate stackable package 100 of FIG. 6 at a later stage during fabrication in accordance with one embodiment. Referring now to FIGS. 6 and 7 together, a circuit pattern 746 is formed within circuit pattern artifact 638. In one embodiment, circuit pattern 746 is formed by plating an electrically conductive material such as copper within circuit pattern artifact 638. In another embodiment, circuit pattern 746 includes one or more metal layers. Generally, circuit pattern 746, sometimes called a second circuit pattern, is formed within second buildup dielectric layer 636.

Circuit pattern 746 includes electrically conductive circuit pattern vias 748 formed in blind via apertures 640 and electrically connected to circuit pattern 528. Circuit pattern 746 further includes electrically conductive traces 750 formed in trace channels 642 and electrically conductive lands 752 formed in land openings 644. Although circuit pattern 746 is set forth as containing particular features, e.g., circuit pattern vias 748, traces 750, and lands 752, in light of this disclosure, those of skill in the art will understand that a circuit pattern can be formed with other and/or different features depending on the particular signal routing desired. Further, instead of being embedded inside of second buildup dielectric layer 636, in another embodiment, traces 750 and lands 752 are formed on lower surface 636L of second buildup dielectric layer 636.

Figure 8:
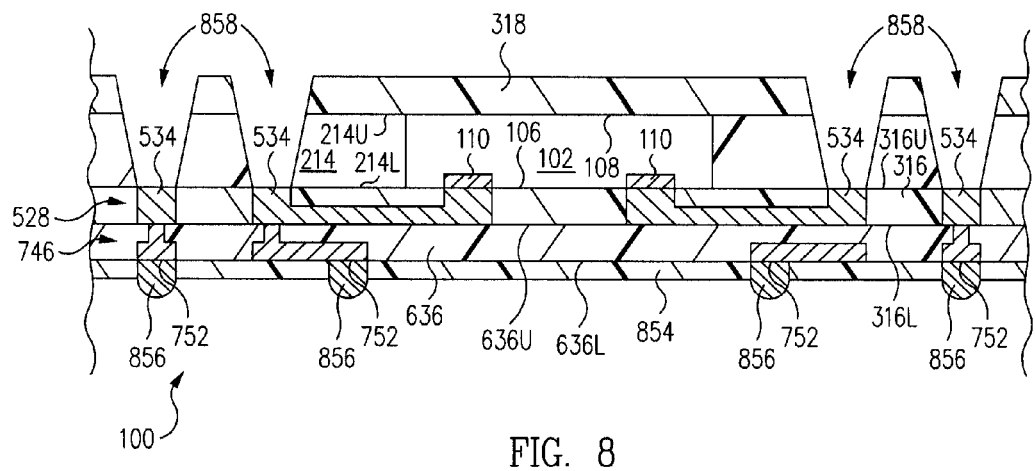
FIGS. 8, 9, 10 are cross-sectional views of the fan out build up substrate stackable package of FIG. 7 at later stages during fabrication in accordance with various embodiments.

FIG. 8 is a cross-sectional view of fan out build up substrate stackable package 100 of FIG. 7 at a later stage during fabrication in accordance with one embodiment. Referring now to FIG. 8, a dielectric solder mask 854 is applied to lower surface 636L of second buildup dielectric layer 636 and patterned to expose lands 752 of circuit pattern 746.

Interconnection balls 856, e.g., solder, are formed on lands 752. Interconnection balls 856 are distributed in a ball grid array (BGA) in one embodiment. Interconnection balls 856 are reflowed, i.e., heated to a melt and re-solidified, to mount fan out build up substrate stackable package 100 to another structure such as a printed circuit motherboard. The formation of interconnection balls 856 is optional, and in one embodiment, interconnection balls 856 are not formed.

Further, via capture pad apertures 858 are formed, e.g., using laser ablation, through package body 214 and backside warpage control layer 318 if backside warpage control layer 318 is formed. Via capture pad apertures 858 extend through package body 214 from upper surface 214U to lower surface 214L and expose via capture pads 534 of circuit pattern 528.

As set forth above, in one embodiment, the exposed surfaces of via capture pads 534 exposed through via capture pad apertures 858 include a solder wettable layer. In another embodiment, after formation of via capture pad apertures 858, a solder wettable layer, e.g., nickel, gold, organic solderability protectant (OSP), is formed on via capture pads 534 through via capture pad apertures 858.

As illustrated in FIG. 8, via capture pad apertures 858 expose via capture pads 534 of circuit pattern 528. This facilitates direct connection to circuit pattern 528, i.e., the first metal layer, of fan out build up substrate stackable package 100. As discussed further below, additional stacked structures such as integrated circuit dies, other active components, passive components, and/or stacked electronic component packages, are mounted to (stacked) on fan out build up substrate stackable package 100 by placing solder balls of the additional structures within via capture pad apertures 858. The solder balls of the stacked structures are reflowed thus physically and electrically connecting the solder balls and thus the stacked structures to via capture pads 534 of circuit pattern 528.

As illustrated in FIG. 8, in accordance with this embodiment, backside warpage control layer 318 remains and covers the entire upper surface 214U of package body 214. In one embodiment, the thickness of backside warpage control layer 318 is approximately equal to the typical gap between upper surface 214U of package body 214 and the lower surface of the stacked structure stacked upon fan out build up substrate stackable package 100. To enhance the mounting between the stacked structure and fan out build up substrate stackable package 100, in one embodiment, backside warpage control layer 318 includes a B-stage epoxy. This B-stage epoxy is cured during reflow mounting of the stacked structure thus bonding the stacked structure to upper surface 214U and inactive surface 108 of electronic component 102.

Figure 9:
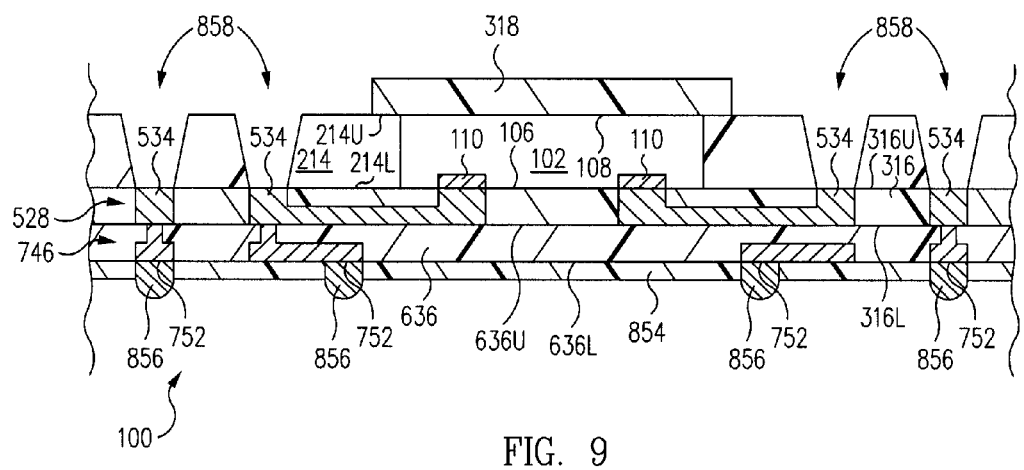

FIG. 9 is a cross-sectional view of fan out build up substrate stackable package 100 of FIG. 7 at a later stage during fabrication in accordance with another embodiment. Referring now to FIG. 9, solder mask 854, optional interconnection balls 856, and via capture pad apertures 858 are formed as discussed above in reference to FIG. 8. In accordance with this embodiment, backside warpage control layer 318 is removed from the outer periphery of upper surface 214U of package body 214. More particularly, backside warpage control layer 318 remains only on and covers the central region of upper surface 214U of package body 214 inwards of via capture pad apertures 858.

Figure 10:
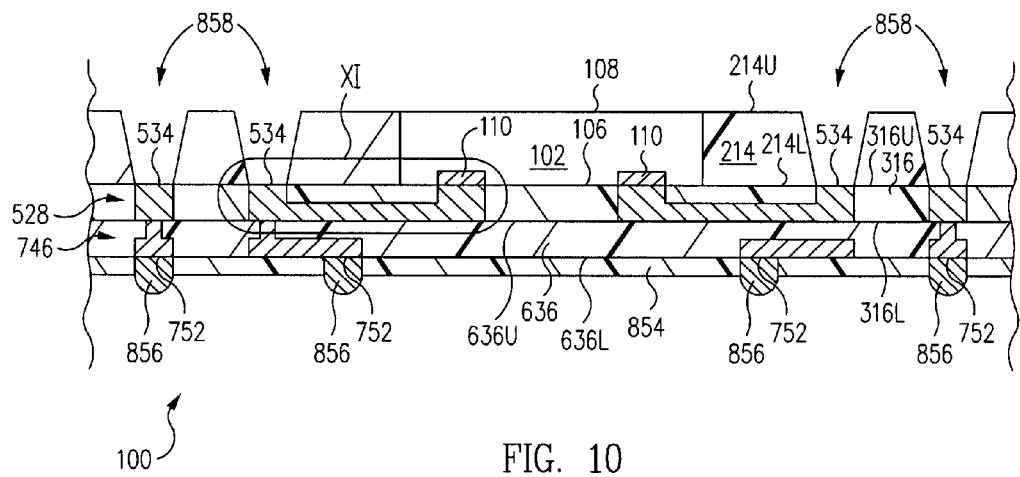

FIG. 10 is a cross-sectional view of fan out build up substrate stackable package 100 of FIG. 7 at a later stage during fabrication in accordance with yet another embodiment. Referring now to FIG. 10, solder mask 854, optional interconnection balls 856, and via capture pad apertures 858 are formed as discussed above in reference to FIG. 8. In accordance with this embodiment, backside warpage control layer 318 (see FIG. 7) is completely removed as illustrated in FIG. 10.

Figure 11:
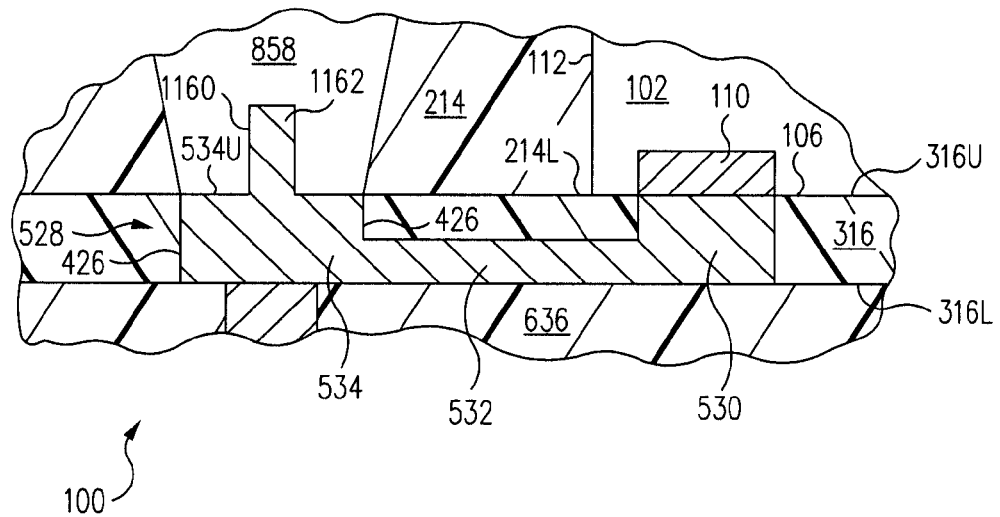
FIG. 11 is an enlarged cross-sectional view of the region XI of the fan out build up substrate stackable package of FIG. 10 in accordance with one embodiment.

FIG. 11 is an enlarged cross-sectional view of the region XI of fan out build up substrate stackable package 100 of FIG. 10 in accordance with one embodiment.

Referring now to FIG. 11, as discussed above, circuit pattern 528 includes bond pad via 530, trace 532, and via capture pad 534. Bond pad via 530 is electrically connected to via capture pad 534 by trace 532.

In accordance with this embodiment, via capture pad 534 extends entirely through first buildup dielectric layer 316 but does not extend into package body 214. Accordingly, an upper, first, surface 534U of via capture pad 534 is parallel to and coplanar with lower surface 214L of package body 214 and active surface 106 of electronic component 102. Active surface 106 of electronic component 102 and lower surface 214L of package body 214 are also parallel to and coplanar with one another.

In accordance with one embodiment, referring now to FIGS. 4 and 11 together, during formation of circuit pattern artifact 420, via capture pad pin apertures 1160 are formed in package body 214 (via capture pad pin apertures 1160 are not illustrated in the embodiment of FIG. 4, see FIG. 11 for example). In one embodiment, via capture pad pin apertures 1160 are cylindrical openings formed by laser ablating into package body 214 through via capture pad openings 426. Via capture pad pin apertures 1160 extend from respective via capture pad openings 426 and into package body 214.

Referring now to FIGS. 5 and 11 together, during formation of circuit pattern 528, via capture pad pin apertures 1160 are filled with the electrically conductive material of circuit pattern 528 to form via capture pad pins 1162 (via capture pad pins 1162 are not illustrated in the embodiment of FIG. 5, see FIG. 11 for example). Via capture pad pins 1162 protrude upwards from upper surfaces 534U of via capture pads 534 and into package body 214 prior to formation of via capture pad apertures 858. Via capture pad pins 1162 have a smaller diameter than via capture pads 534.

Referring now to FIG. 11, after formation of via capture pad apertures 858, via capture pad pins 1162 protrude upwards from upper surfaces 534U of via capture pads 534 and into via capture pad apertures 858. During mounting of a stacked structure to fan out build up substrate stackable package 100, via capture pad pins 1162 provide controlled collapse of the stacked structure solder balls, e.g., BGA balls. In this manner, via capture pad pins 1162 minimized the possibility of open solder joints, i.e., a failed solder connection, between the stacked structure and via capture pads 534.

Figure 12:
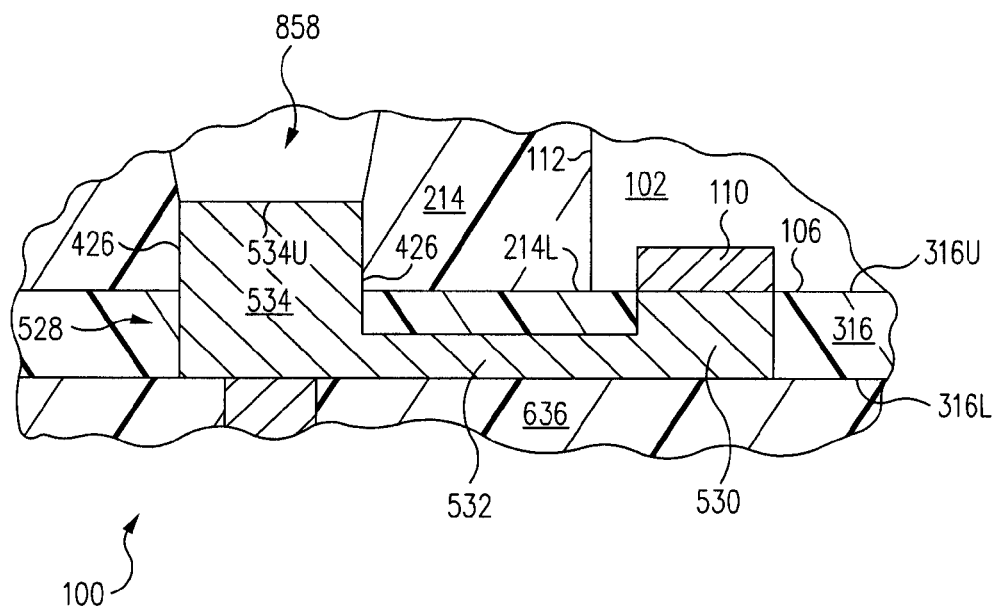
FIG. 12 is an enlarged cross-sectional view of the region XI of the fan out build up substrate stackable package of FIG. 10 in accordance with another embodiment.

FIG. 12 is an enlarged cross-sectional view of the region XI of fan out build up substrate stackable package 100 of FIG. 10 in accordance with another embodiment. Referring now to FIG. 12, as discussed above, circuit pattern 528 includes bond pad via 530, trace 532, and via capture pad 534. Bond pad via 530 is electrically connected to via capture pad 534 by trace 532.

In accordance with this embodiment, via capture pad 534 extends entirely through first buildup dielectric layer 316 and extends into package body 214. Accordingly, upper surface 534U of via capture pad 534 is parallel to but elevated above lower surface 214L of package body 214 and active surface 106 of electronic component 102. More particularly, upper surface 534U of via capture pad 534 is between lower surface 214L and upper surface 214U of package body 214. Via capture pad 534 is embedded into package body 214.

In accordance with one embodiment, referring now to FIGS. 4 and 12 together, during formation of circuit pattern artifact 420, via capture pad openings 426 are formed entirely through first buildup dielectric layer 316 and into package body 214 (via capture pad openings 426 do not extend into package body 214 in the embodiment illustrated in FIG. 4, see FIG. 12 for example). In one embodiment, via capture pad openings 426 are formed by laser ablating into package body 214.

Referring now to FIGS. 5 and 12 together, during formation of circuit pattern 528, via capture pad openings 426 are filled to form via capture pads 534. Via capture pads 534 protrude upwards and extend into package body 214 (via capture pads 534 do not protrude into package body 214 in the embodiment illustrated in FIG. 5, see FIG. 12 for example).

Referring now to FIG. 12, during mounting of a stacked structure to fan out build up substrate stackable package 100, increased thickness via capture pads 534 reduce the distance into which the solder balls of the stacked structure must extend into via capture pad apertures 858 to contact capture pads 534. In this manner, increased thickness via capture pads 534 minimized the possibility of open solder joints, i.e., a failed solder connection, between the stacked structure and via capture pads 534. Further, increased thickness via capture pads 534 adjust the seating plane of the stacked structure to optimize the gap between fan out build up substrate stackable package 100 and the stacked structure.

Referring again to FIG. 10, fan out build up substrate stackable package 100 includes first buildup dielectric layer 316 and second buildup dielectric layer 636, i.e., two buildup dielectric layers. In accordance with the embodiments illustrated in FIGS. 13, 14, 15, 16, 17, a fan out build up substrate stackable package 1300 is fabricated using only a single buildup dielectric layer and thus minimizing the overall thickness of fan out build up substrate stackable package 1300.

Figure 13:
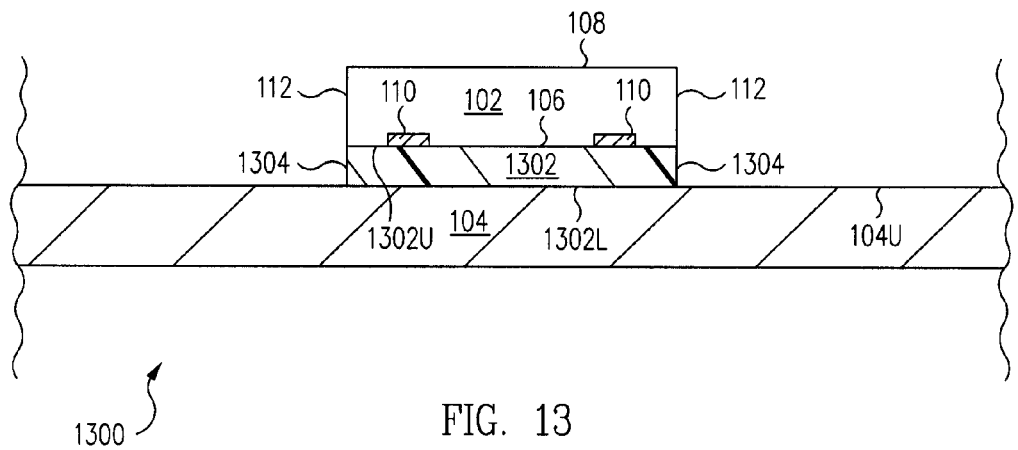
FIG. 13 is a cross-sectional view of a fan out build up substrate stackable package during fabrication in accordance with another embodiment.

FIG. 13 is a cross-sectional view of a fan out build up substrate stackable package 1300 during fabrication in accordance with another embodiment.

Referring now to FIG. 13, an upper, e.g., first, surface 1302U of a dielectric film 1302 is applied to active surface 106 including bond pads 110 of electronic component 102. In one embodiment, a sheet of dielectric film 1302 is applied to a wafer comprising a plurality of electronic components 102 prior to dicing (cutting) of the wafer to form singulated electronic components 102. This sheet of dielectric film 1302 is applied after formation of the Under Bump Metallization (UBM) and prior to wafer dicing. The wafer including sheet of dielectric film 1302 is diced to form singulated electronic components 102 each having a dielectric film 1302 attached.

As illustrated in FIG. 13, a lower, e.g., second, surface 1302L of dielectric film 1302 is mounted to upper surface 104U of carrier 104. Dielectric film 1302 further includes sides 1304 extending between upper surface 1302U and lower surface 1302L of dielectric film 1302. Sides 1304 are coplanar with sides 112 of electronic component 102.

Figure 14:
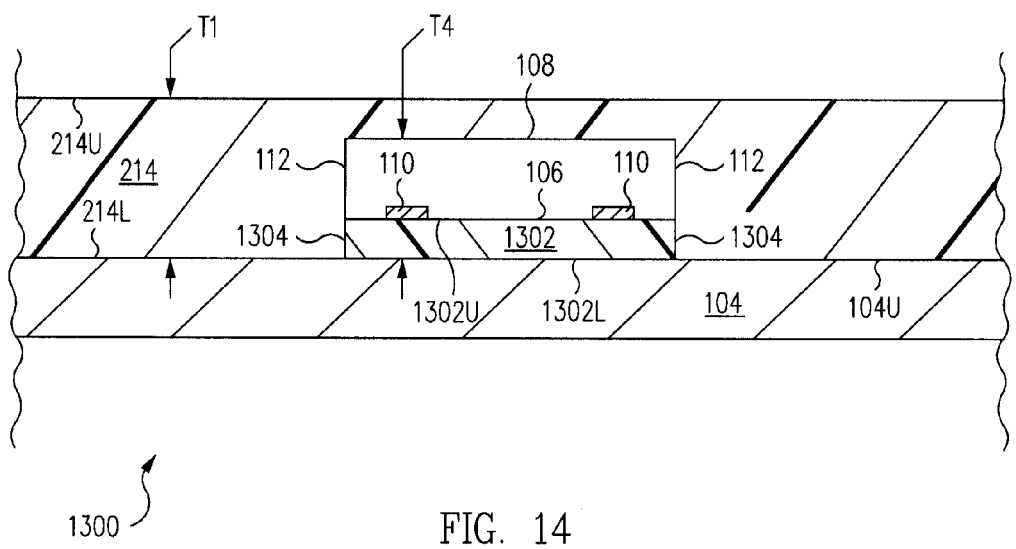
FIGS. 14, 15, 16, 17 are cross-sectional views of the fan out build up substrate stackable package of FIG. 13 at later stages during fabrication in accordance with various embodiments.

FIG. 14 is a cross-sectional view of fan out build up substrate stackable package 1300 of FIG. 13 at a later stage during fabrication in accordance with one embodiment. Referring now to FIG. 14, electronic component 102 and dielectric film 1302 are encapsulated in package body 214.

Illustratively, electronic component 102, dielectric film 1302, and carrier 104 are placed into a mold and mold compound is injected into the mold and around electronic component 102 and dielectric film 1302. This mold compound hardens to form package body 214.

Package body 214 completely encloses electronic component 102, dielectric film 1302, and the exposed portion of upper surface 104U of carrier 104. More particularly, package body 214 completely encloses inactive surface 108 and sides 112 of electronic component 102. Further, package body 214 completely encloses sides 1304 of dielectric film 1302.

Package body 214 is thicker having a thickness T1 greater than a thickness T4 of electronic component 102 and dielectric film 1302. More particularly, upper surface 214U is above and spaced apart from inactive surface 108.

Figure 15:
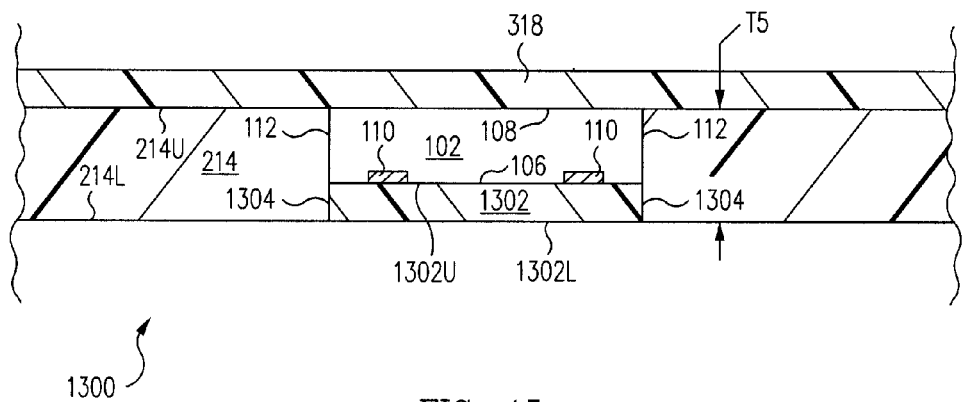

FIG. 15 is a cross-sectional view of fan out build up substrate stackable package 1300 of FIG. 14 at a later stage during fabrication in accordance with one embodiment. Referring now to FIGS. 14 and 15 together, package body 214 is ground down from upper surface 214U to expose inactive surface 108 of electronic component 102. In one embodiment, inactive surface 108 is also ground down thus thinning both package body 214 and electronic component 102.

Accordingly, after grinding, package body 214 and electronic component 102 have an equal thickness T5 less than thicknesses T1, T4 prior to grinding. Thinning package body 214 and electronic component 102 minimizes the overall thickness of fan out build up substrate stackable package 1300. Grinding of package body 214 and electronic component 102 is optional, and in one embodiment, is not performed.

Package body 214 is a relatively rigid material allowing carrier 104 (FIG. 14) to be removed as illustrated in FIG. 15. In various embodiments, carrier 104 is removed by peeling, etching, grinding, or other removal technique.

Referring now to FIG. 15, optionally, a backside warpage control layer 318 is applied to upper surface 214U of package body 214. In the case where inactive surface 108 of electronic component 102 is exposed, backside warpage control layer 318 is also applied to inactive surface 108.

Figure 16:
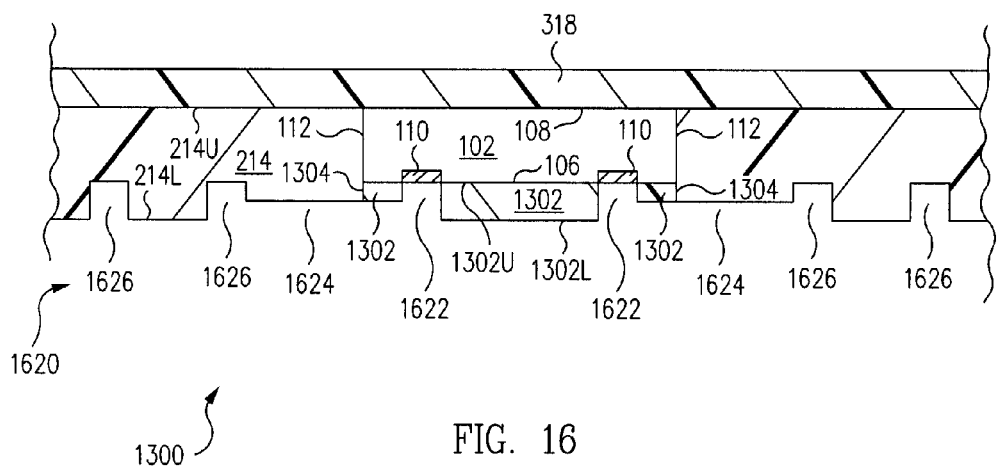

FIG. 16 is a cross-sectional view of fan out build up substrate stackable package 1300 of FIG. 15 at a later stage during fabrication in accordance with one embodiment. Referring now to FIG. 16, a circuit pattern artifact 1620 is formed in dielectric film 1302 and package body 214. Circuit pattern artifact 1620 is formed using laser ablation in one embodiment. Circuit pattern artifact 1620 is similar or identical to circuit pattern artifact 420 of FIG. 4 except that circuit pattern artifact 1620 is formed within dielectric film 1302 and package body 214 whereas circuit pattern artifact 420 of FIG. 4 is formed in first buildup dielectric layer 316.

Circuit pattern artifact 1620 is a positive image of the circuit pattern to be formed in dielectric film 1302 and package body 214. Circuit pattern artifact 1620 includes bond pad via apertures 1622 extending entirely through dielectric film 1302 and exposing bond pads 110. Circuit pattern artifact 420 further includes trace channels 1624 and via capture pad openings 1626.

Via capture pad openings 1626 are formed within package body 214. Trace channels 1624 are formed within both dielectric film 1302 and package body 214. Trace channels 1624 extend between bond pad via apertures 1622 and via capture pad openings 1626.

Figure 17:
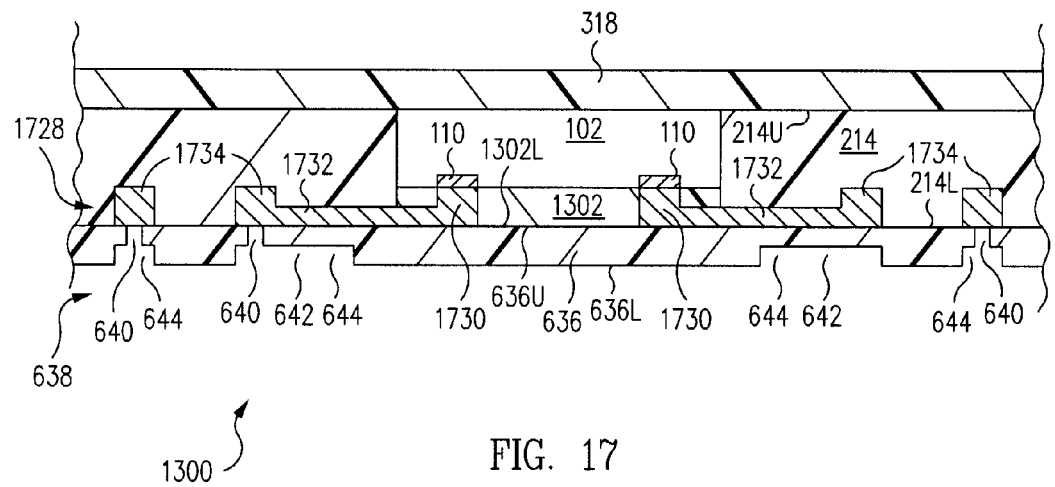

FIG. 17 is a cross-sectional view of fan out build up substrate stackable package 1300 of FIG. 16 at a later stage during fabrication in accordance with one embodiment. Referring now to FIGS. 16 and 17 together, a circuit pattern 1728 is formed within circuit pattern artifact 1620. In one embodiment, circuit pattern 1728, sometimes called a first metal layer, is formed by plating an electrically conductive material such as copper within circuit pattern artifact 1620. Circuit pattern 1728 is similar or identical to circuit pattern 528 of FIG. 5 except that circuit pattern 1728 is formed within dielectric film 1302 and package body 214 whereas circuit pattern 528 of FIG. 5 is formed in first buildup dielectric layer 316.

In one embodiment, circuit pattern 1728 includes one or more metal layers. For example, initially a solder wettable layer such as nickel and/or gold is plated in circuit pattern artifact 1620 to partially fill circuit pattern artifact 1620. Circuit pattern artifact 1620 is then completely filled with a second metal such as copper. In this manner, the exposed surfaces of via capture pads of circuit pattern 1728 are solder wettable as discussed in greater detail below.

Circuit pattern 1728 includes electrically conductive bond pad vias 1730 formed in bond pad via apertures 1622 and electrically connected to bond pads 110. Bond pad vias 1730 are formed within dielectric film 1302.

Circuit pattern 1728 further includes electrically conductive traces 1732 formed within trace channels 1624 and electrically conductive via capture pads 1734 formed within via capture pad openings 1626. Traces 1732 are formed within both dielectric film 1302 and package body 214. Via capture pads 1734 are formed within package body 214.

Although circuit pattern 1728 is set forth as containing particular features, e.g., bond pad vias 1730, traces 1732, and via capture pads 1734, in light of this disclosure, those of skill in the art will understand that a circuit pattern can be formed with other and/or different features depending on the particular signal routing desired. Further, instead of being embedded inside of dielectric film 1302 and package body 214, in another embodiment, traces 1732 are formed on lower surfaces 1302L, 214L of dielectric film 1302 and package body 214, respectively.

After formation of circuit pattern 1728, an upper, e.g., first, surface 636U of a buildup dielectric layer 636 is applied to lower surfaces 214L, 1302L of package body 214 and dielectric film 1302, respectively, and to circuit pattern 1728.

A circuit pattern artifact 638 is formed in a lower, e.g., second, surface 636L of buildup dielectric layer 636. Circuit pattern artifact 638 is formed using laser ablation, selective etching, or other technique.

Buildup dielectric layer 636 and circuit pattern artifact 638 of FIG. 17 are similar or identical to second buildup dielectric layer 636 and circuit pattern artifact 638 as described above in reference to FIG. 6. However, in accordance with this embodiment, buildup dielectric layer 636 is applied directly to lower surfaces 214L, 1302L of package body 214 and dielectric film 1302, respectively, and to circuit pattern 1728 thus avoiding application of first buildup dielectric layer 316 as also illustrated in FIG. 6.

Circuit pattern artifact 638 is a positive image of the circuit pattern to be formed in buildup dielectric layer 636. Circuit pattern artifact 638 includes blind via apertures 640 extending entirely through buildup dielectric layer 636 and exposing circuit pattern 1728. Circuit pattern artifact 638 further includes trace channels 642 and land openings 644.

Fan out build up substrate stackable package 1300 of FIG. 17 is further processed as set forth above in reference to the embodiment of FIGS. 7, 8, 9, 10, 11, 12 and so these fabrication operations are not repeated. A notable exception is that via capture pad apertures 858 of FIG. 8 extend to and expose via capture pads 1734 of circuit pattern 1728 of FIG. 17 instead of via capture pads 534 of FIG. 8.

Figure 18:
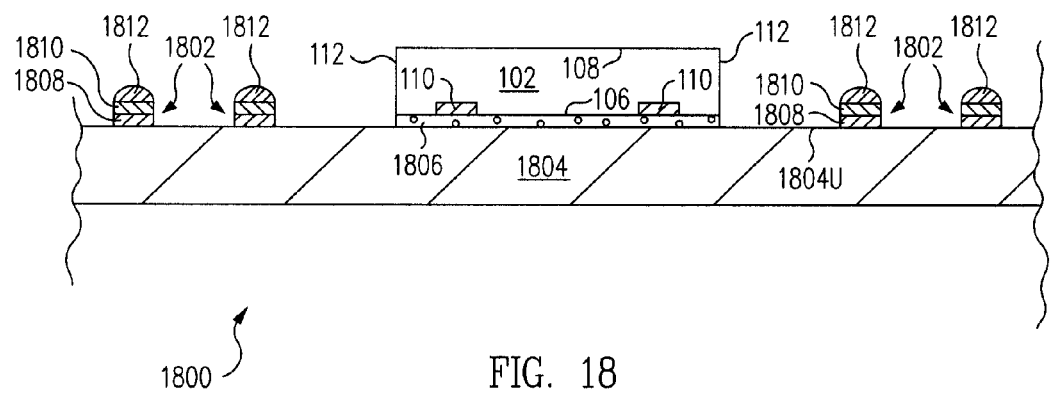
FIG. 18 is a cross-sectional view of a fan out build up substrate stackable package during fabrication in accordance with yet another embodiment.

FIG. 18 is a cross-sectional view of a fan out build up substrate stackable package 1800 during fabrication in accordance with yet another embodiment. Referring now to FIG. 18, in accordance with this embodiment, via capture pads 1802 are formed on an upper, e.g., first, surface 1804U of a carrier 1804.

In one embodiment, carrier 1804 is an electrically conductive material such as copper. Via capture pads 1802 are plated on carrier 1804 using carrier 1804 as a plating electrode.

In one embodiment, via capture pads 1802 include an etch stop layer 1808 and a solder wettable layer 1810. Carrier 1804, e.g., copper, is selectively etchable compared to etch stop layer 1808, e.g., nickel. Solder wettable layer 1810, e.g., gold, is wettable by solder. Optionally, solder 1812, sometimes called a Solder On Pad (SOP), is applied to via capture pads 1802. Application of solder 1812 is optional, and in one embodiment, solder 1812 is not applied.

Further, active surface 106 of electronic component 102 is mounted to upper surface 1804U of carrier 1804 by an adhesive 1806, e.g., a die attach material. In one embodiment, adhesive 1806 is a strong adhesive thus avoiding undesirable movement of electronic component 102 on carrier 1804 during molding.

Figure 19:
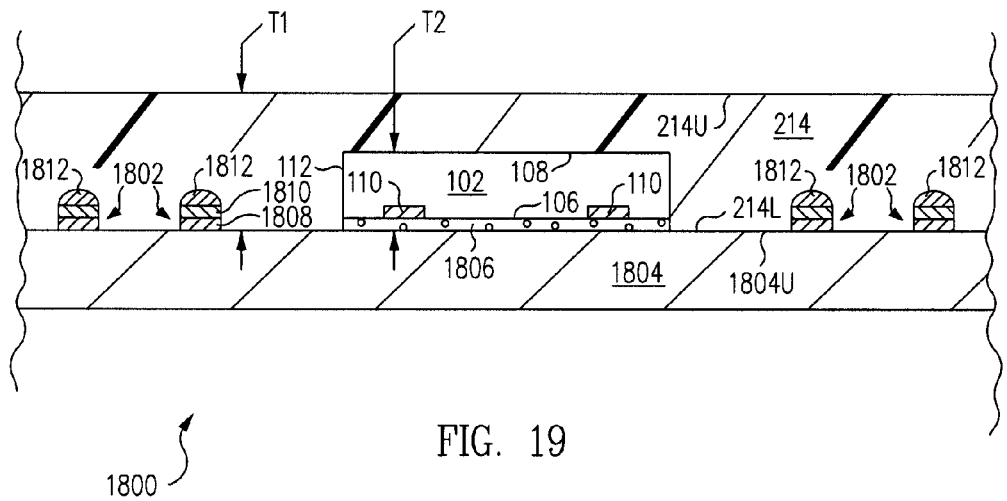
FIGS. 19, 20, 21, 22, 23, 24 are cross-sectional views of the fan out build up substrate stackable package of FIG. 18 at later stages during fabrication in accordance with various embodiments.

FIG. 19 is a cross-sectional view of fan out build up substrate stackable package 1800 of FIG. 18 at a later stage during fabrication in accordance with one embodiment. Referring now to FIG. 19, electronic component 102, via capture pads 1802, and solder 1812 are encapsulated in a dielectric package body 214.

Illustratively, electronic component 102, via capture pads 1802, solder 1812 and carrier 1804 are placed into a mold and mold compound is injected into the mold and around electronic component 102, via capture pads 1802, and solder 1812 to form package body 214.

Package body 214 includes a lower, e.g., first, surface 214L attached to upper surface 1804U of carrier 1804 and an upper, e.g., second, surface 214U. Package body 214 completely encloses electronic component 102 including inactive surface 108 and sides 112 and the exposed portion of upper surface 1804U of carrier 1804. Further, package body 214 completely encloses via capture pads 1802 and solder 1812.

Package body 214 is thicker having a thickness T1 greater than a thickness T2 of electronic component 102 including adhesive 1806. The thickness of adhesive 1806 is generally negligible so electronic component 102 shall be referred to as having thickness T2. More particularly, upper surface 214U is above and spaced apart from inactive surface 108.

Figure 20:
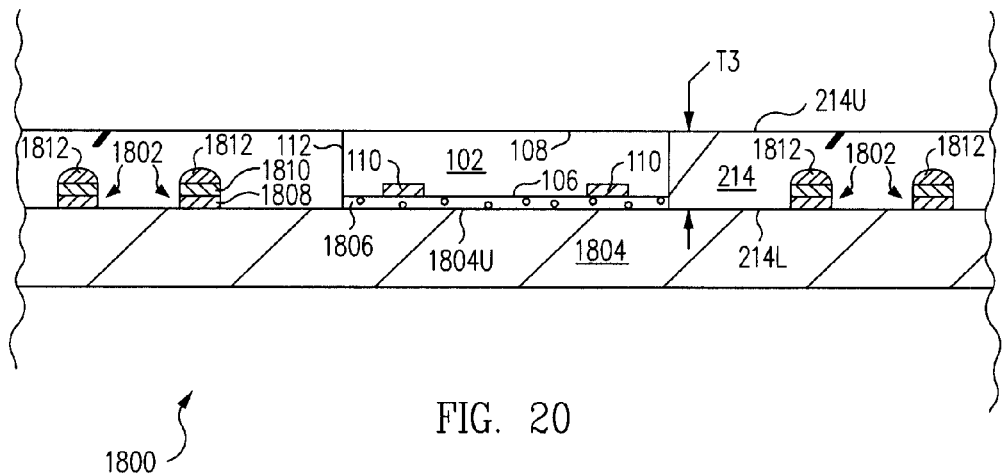

FIG. 20 is a cross-sectional view of fan out build up substrate stackable package 1800 of FIG. 19 at a later stage during fabrication in accordance with one embodiment. Referring now to FIGS. 19 and 20 together, package body 214 is ground down from upper surface 214U to expose inactive surface 108 of electronic component 102. In one embodiment, inactive surface 108 is also ground down thus thinning both package body 214 and electronic component 102.

Accordingly, after grinding, package body 214 and electronic component 102 have an equal thickness T3 less than thicknesses T1, T2 prior to grinding. Thinning package body 214 and electronic component 102 minimizes the overall thickness of fan out build up substrate stackable package 1800. Grinding of package body 214 and electronic component 102 is optional, and in one embodiment, is not performed.

Figure 21:
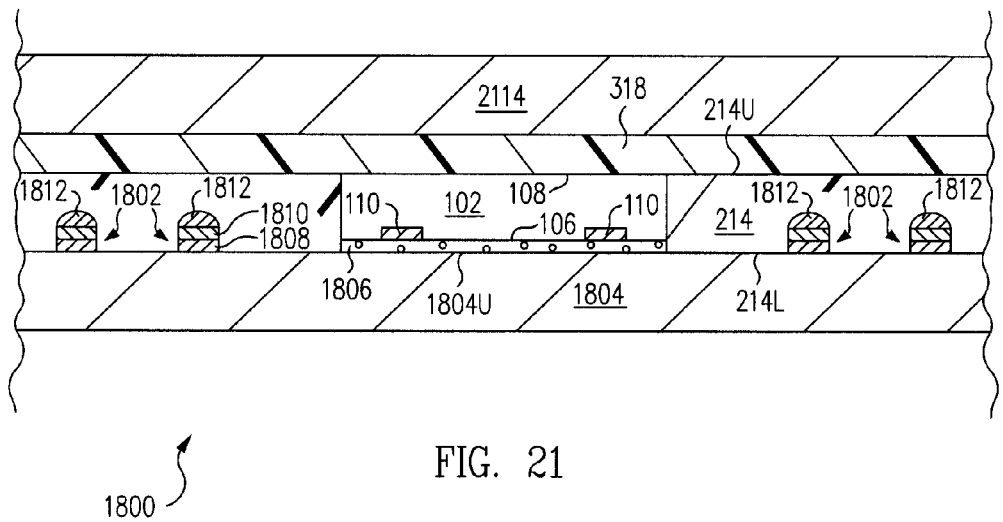

FIG. 21 is a cross-sectional view of fan out build up substrate stackable package 1800 of FIG. 20 at a later stage during fabrication in accordance with one embodiment. Referring now to FIG. 21, optionally, a backside warpage control layer 318 is applied to upper surface 214U of package body 214. In the case where inactive surface 108 of electronic component 102 is exposed, backside warpage control layer 318 is also applied to inactive surface 108.

As a further option, backside warpage control layer 318 is applied to a carrier 2114, e.g., stainless steel. Carrier 2114 adds rigidity and support to fan out build up substrate stackable package 1800 during fabrication as set forth below. Application of backside warpage control layer 318 and/or carrier 2114 is optional, and in one embodiment, only backside warpage control layer 318 is applied. In another embodiment, neither backside warpage control layer 318 nor carrier 2114 are applied.

Figure 22:
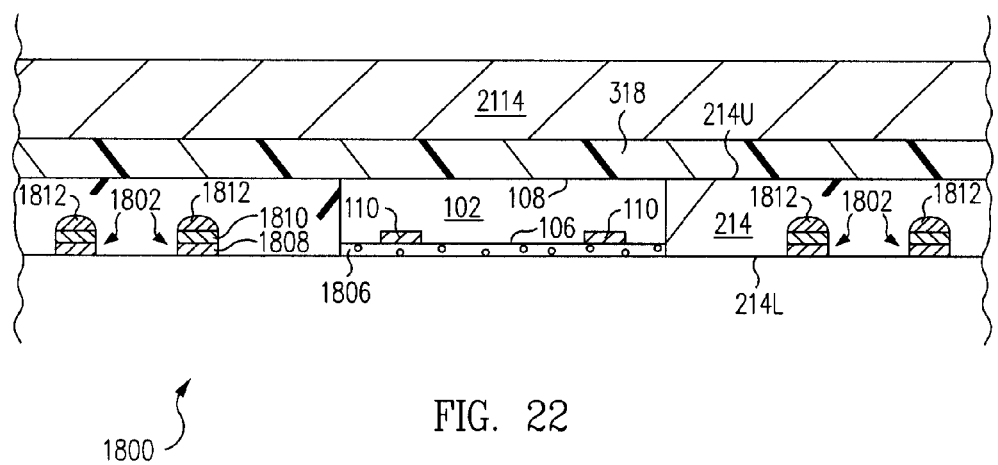

FIG. 22 is a cross-sectional view of fan out build up substrate stackable package 1800 of FIG. 21 at a later stage during fabrication in accordance with one embodiment. Referring now to FIG. 22, carrier 1804 is removed. In one embodiment, carrier 1804 is copper and is removed by etching. Recall that etch stop layer 1808 is selectively etchable compared to carrier 1804 and thus provides an etch stop. In one embodiment, backside warpage control layer 318 and adhesive 1806 protect electronic component 102 during the etching process. In another embodiment, carrier 1804 is stainless steel and is removed by peeling.

Figure 23:
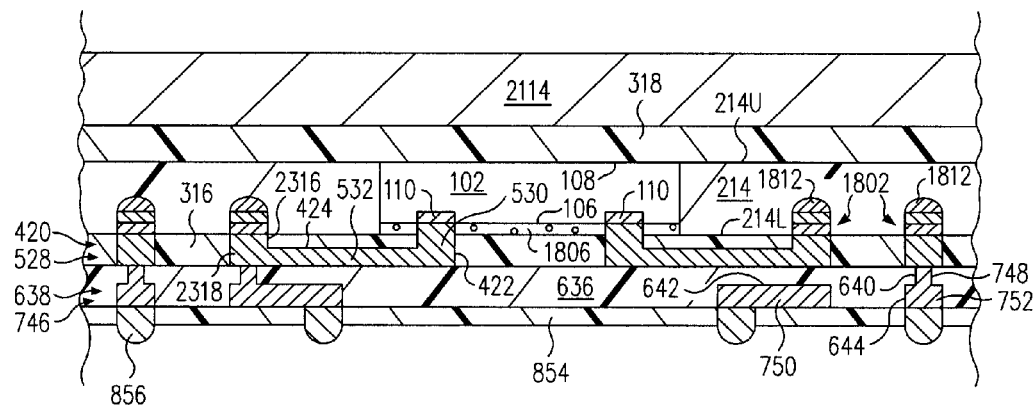

FIG. 23 is a cross-sectional view of fan out build up substrate stackable package 1800 of FIG. 22 at a later stage during fabrication in accordance with one embodiment. Referring now to FIG. 23, a first buildup dielectric layer 316 is applied to lower surface 214L of package body 214, via capture pads 1802, and adhesive 1806. A circuit pattern artifact 420 is formed in first buildup dielectric layer 316. Circuit pattern artifact 420 is formed using laser ablation, selective etching, or other technique.

Circuit pattern artifact 420 is a positive image of the circuit pattern to be formed in first buildup dielectric layer 316. Circuit pattern artifact 420 includes bond pad via apertures 422 extending entirely through first buildup dielectric layer 316, adhesive 1806 and exposing bond pads 110. Circuit pattern artifact 420 further includes trace channels 424 and capture pad via apertures 2316. In accordance with this embodiment, capture pad via apertures 2316 are openings extending through first buildup dielectric layer 316 and exposing via capture pads 1802.

A circuit pattern 528 is formed within circuit pattern artifact 420. In one embodiment, circuit pattern 528 is formed by plating an electrically conductive material such as copper within circuit pattern artifact 420.

Circuit pattern 528 includes electrically conductive bond pad vias 530 formed in bond pad via apertures 422 and electrically connected to bond pads 110. Circuit pattern 528 further includes electrically conductive traces 532 formed within trace channels 424 and electrically conductive capture pad vias 2318 formed within capture pad via apertures 2316. Capture pad vias 2318 extend through first buildup dielectric layer 316 and are electrically connected to via capture pads 1802.

Although circuit pattern 528 is set forth as containing particular features, e.g., bond pad vias 530, traces 532, and capture pad vias 2318, in light of this disclosure, those of skill in the art will understand that a circuit pattern can be formed with other and/or different features depending on the particular signal routing desired.

Further, a second buildup dielectric layer 636 is applied to first buildup dielectric layer 316 and to circuit pattern 528.

A circuit pattern artifact 638 is formed in second buildup dielectric layer 636. Circuit pattern artifact 638 is formed using laser ablation, selective etching, or other technique.

Circuit pattern artifact 638 is a positive image of the circuit pattern to be formed in second buildup dielectric layer 636. Circuit pattern artifact 638 includes blind via apertures 640 extending entirely through second buildup dielectric layer 636 and exposing circuit pattern 528. Circuit pattern artifact 638 further includes trace channels 642 and land openings 644.

A circuit pattern 746 is formed within circuit pattern artifact 638. In one embodiment, circuit pattern 746 is formed by plating an electrically conductive material such as copper within circuit pattern artifact 638. In another embodiment, circuit pattern 746 includes one or more metal layers.

Circuit pattern 746 includes electrically conductive circuit pattern vias 748 formed in blind via apertures 640 and electrically connected to circuit pattern 528. Circuit pattern 746 further includes electrically conductive traces 750 formed in trace channels 642 and electrically conductive lands 752 formed in land openings 644. Although circuit pattern 746 is set forth as containing particular features, e.g., circuit pattern vias 748, traces 750, and lands 752, in light of this disclosure, those of skill in the art will understand that a circuit pattern can be formed with other and/or different features depending on the particular signal routing desired.

A dielectric solder mask 854 is applied to second buildup dielectric layer 636 and patterned to expose lands 752 of circuit pattern 746.

Interconnection balls 856, e.g., solder, are formed on lands 752. Interconnection balls 856 are distributed in a ball grid array (BGA) in one embodiment. The formation of interconnection balls 856 is optional, and in one embodiment, interconnection balls 856 are not formed.

Figure 24:
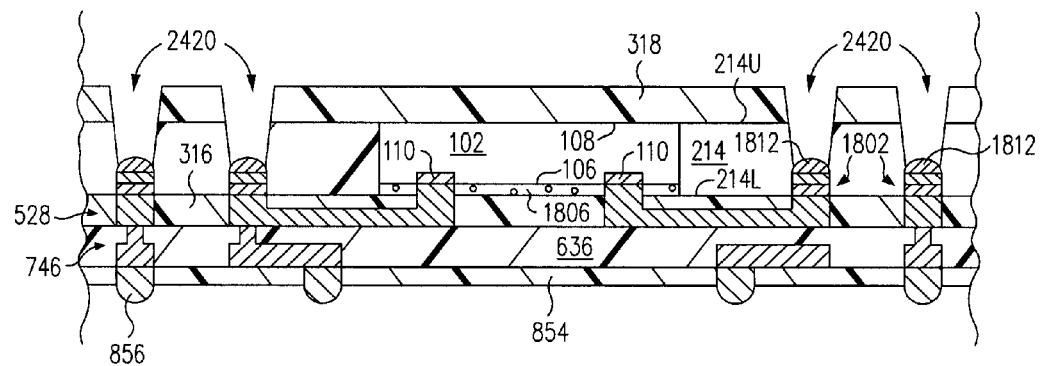

FIG. 24 is a cross-sectional view of fan out build up substrate stackable package 1800 of FIG. 23 at a later stage during fabrication in accordance with one embodiment. Referring now to FIGS. 23 and 24, carrier 2114 (FIG. 23) is peeled away leaving backside warpage control layer 318 exposed as illustrated in FIG. 24.

Referring now to FIG. 24, via capture pad apertures 2420 are formed, e.g., using laser ablation, through package body 214 and backside warpage control layer 318 if backside warpage control layer 318 is formed. Via capture pad apertures 2420 expose via capture pads 1802 or solder 1812 if solder 1812 is formed. Generally, via capture pad apertures 2420 are aligned with respective via capture pads 1802.

Figure 25:
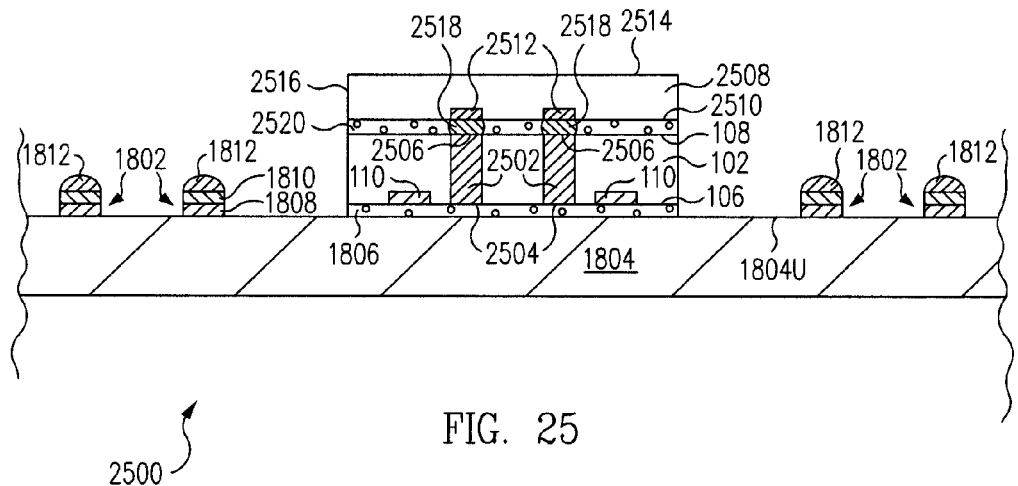
FIG. 25 is a cross-sectional view of a fan out build up substrate stackable package in accordance with another embodiment.

FIG. 25 is a cross-sectional view of a fan out build up substrate stackable package 2500 in accordance with another embodiment. Fan out build up substrate stackable package 2500 of FIG. 25 is similar to fan out build up substrate stackable package 1800 of FIG. 18 and only the significant differences are discussed below. Referring now to FIG. 25, in accordance with this embodiment, electrically conductive through vias 2502 are formed through electronic component 102.

More particularly, through vias 2502 extend between active surface 106 and inactive surface 108. The ends of through vias 2502 at active surface 106 define active surface through via terminals 2504. Further, the ends of through vias 2502 at inactive surface 108 define inactive surface through via terminals 2506. Active surface through via terminals 2504 are electrically connected to inactive surface through via terminals 2506 by through vias 2502.

A stacked flip chip electronic component 2508, e.g., an active components such as an integrated circuit die, a passive component, and/or electronic component package, is mounted to electronic component 102.

More particularly, stacked flip chip electronic component 2508 includes an active surface 2510 having bond pads 2512 thereon. Stacked flip chip electronic component 2508 further includes an inactive surface 2514 and sides 2516 extending between active surface 2510 and inactive surface 2514.

Bond pads 2512 are physically and electrically mounted to inactive surface through via terminals 2506 by flip chip bumps 2518, e.g., solder. Optionally, an underfill 2520 is applied between active surface 2510 of stacked flip chip electronic component 2508 and inactive surface 108 of electronic component 102 and around flip chip bumps 2518.

Fan out build up substrate stackable package 2500 of FIG. 25 is further process as set forth above in reference to the embodiment of FIGS. 19, 20, 21, 22, 23, 24 and so these fabrication operations are not repeated.

Notable exceptions are that both stacked flip chip electronic component 2508 and electronic component 102 are encapsulated within package body 214. In contrast, recall that in FIG. 19, only electronic component 102 is encapsulated within package body 214.

Further, package body 214 is not ground down or, if ground down, is ground down to expose inactive surface 2514 of stacked flip chip electronic component 2508. In contrast, recall that in FIG. 20, package body 214 is ground down to expose inactive surface 108 of electronic component 102.

Further, bond pad vias 530 of circuit pattern 528 extend entirely through first buildup dielectric layer 316, adhesive 1806 and are electrically connected to both bond pads 110 and active surface through via terminals 2504. In contrast, recall that in FIG. 23, bond pad vias 530 are electrically connected to only bond pads 110.

Figure 26:
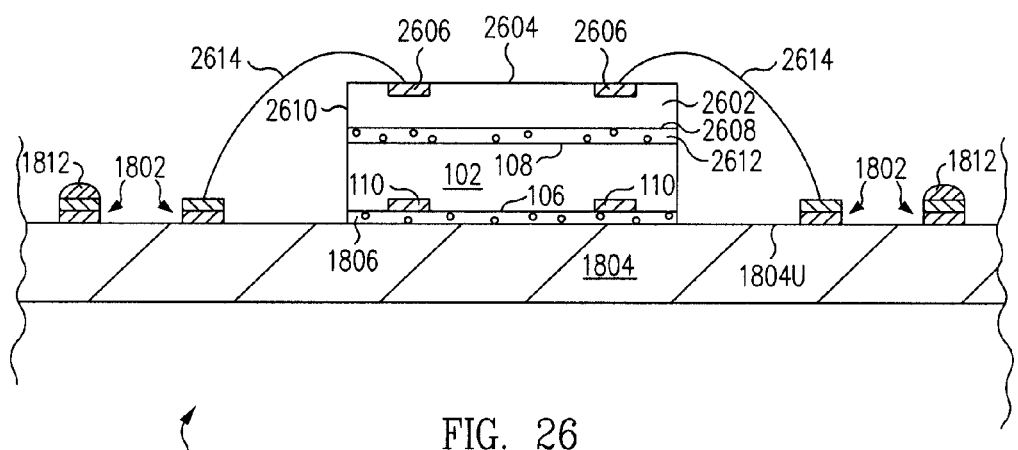
FIG. 26 is a cross-sectional view of a fan out build up substrate stackable package in accordance with one embodiment.

FIG. 26 is a cross-sectional view of a fan out build up substrate stackable package 2600 in accordance with one embodiment. Fan out build up substrate stackable package 2600 of FIG. 26 is similar to fan out build up substrate stackable package 1800 of FIG. 18 and only the significant differences are discussed below.

Referring now to FIG. 26, in accordance with this embodiment, a stacked wirebond electronic component 2602, e.g., an active components such as an integrated circuit die, a passive component, and/or electronic component package, is mounted to electronic component 102.

More particularly, stacked wirebond electronic component 2602 includes an active surface 2604 having bond pads 2606 thereon. Stacked wirebond electronic component 2602 further includes an inactive surface 2608 and sides 2610 extending between active surface 2604 and inactive surface 2608.

Inactive surface 2608 of stacked wirebond electronic component 2602 is mounted to inactive surface 108 of electronic component 102 with an adhesive 2612. Bond pads 2606 of stacked wirebond electronic component 2602 are electrically connected to via capture pads 1802 with bond wires 2614. In one embodiment, the via capture pads 1802 electrically connected to bond wires 2614 are formed without solder 1812 as illustrated in FIG. 26.

Fan out build up substrate stackable package 2600 of FIG. 26 is further process as set forth above in reference to the embodiment of FIGS. 19, 20, 21, 22, 23, 24 and so these fabrication operations are not repeated.

Notable exceptions are that both stacked wirebond electronic component 2602, electronic component 102, and bond wires 2614 are encapsulated within package body 214. In contrast, recall that in FIG. 19, only electronic component 102 is encapsulated within package body 214.

Further, package body 214 is not ground down or, if ground down, is only ground down such that a sufficient amount of package body 214 remains to enclose bond wires 2614. In contrast, recall that in FIG. 20, package body 214 is ground down to expose inactive surface 108 of electronic component 102.

Although formation of individual packages is described above, in other embodiments, a plurality of packages are formed simultaneously in an array using the methods as described above. The array is singulated to singulate the individual packages from one another.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A fan out build up substrate stackable package comprising: an integrated circuit chip comprising an active surface comprising a bond pad; a package body directly contacting and enclosing sides of the integrated circuit chip, the package body comprising a first surface coplanar with the active surface of the integrated circuit chip; a first buildup dielectric layer comprising a first surface applied to the active surface of the integrated circuit chip and the first surface of the package body; a first circuit pattern electrically connected to the bond pad, the first circuit pattern comprising a via capture pad formed within the first buildup dielectric layer and a trace embedded in the first buildup dielectric layer at a second surface of the first buildup dielectric layer; and a via capture pad aperture extending through the package body but not through the first buildup dielectric layer and exposing the via capture pad, wherein the package body further comprises a second surface, the via capture pad aperture extending from the second surface to and ending at the first surface of the package body; further comprising a backside warpage control layer applied to the second surface of the package body.

2. The fan out build up substrate stackable package of claim 1 wherein the integrated circuit chip further comprises an inactive surface coplanar with the second surface of the package body.

3. The fan out build up substrate stackable package of claim 1 wherein the integrated circuit chip further comprises an inactive surface, the second surface of the package body being above and spaced apart from the inactive surface of the integrated circuit chip.

4. The fan out build up substrate stackable package of claim 1 wherein the backside warpage control layer has a thermal coefficient of expansion similar to the first buildup dielectric layer.

5. The fan out build up substrate stackable package of claim 1 wherein the backside warpage control layer covers only a central region of the second surface of the package body.

6. The fan out build up substrate stackable package of claim 1 wherein the first circuit pattern further comprises: a bond pad via extending entirely through the first buildup dielectric layer and being electrically connected to the bond pad, wherein the trace electrically connects the bond pad via to the via capture pad.

7. The fan out build up substrate stackable package of claim 1 further comprising: a second buildup dielectric layer applied to the first buildup dielectric layer and to the first circuit pattern; and a second circuit pattern formed within the second buildup dielectric layer and electrically connected to the first circuit pattern, the second circuit pattern comprising lands.

8. The fan out build up substrate stackable package of claim 1 wherein the via capture pad comprises a first surface coplanar with the first surface of the package body and the active surface of the integrated circuit chip.

9. The fan out build up substrate stackable package of claim 8 further comprising a via capture pad pin protruding from the first surface of the via capture pad and into the via capture pad aperture.

10. The fan out build up substrate stackable package of claim 1 wherein the via capture pad extends entirely through the first buildup dielectric layer and into the package body, the via capture pad comprising a first surface between the first surface of the package body and a second surface of the package body.

11. A fan out build up substrate stackable package comprising: an electronic component comprising an active surface comprising a bond pad; a dielectric film comprising a first surface applied to the active surface of the electronic component including the bond pad, the dielectric film further comprising a second surface; a package body enclosing the electronic component and the dielectric film, the package body comprising a first surface coplanar with the second surface of the dielectric film; an integrally plated first circuit pattern formed within the dielectric film and the package body and electrically connected to the bond pad, the first circuit pattern comprising a via capture pad formed within the package body and a trace embedded within the dielectric film at the second surface of the dielectric film and within the package body at the first surface of the package body; and a via capture pad aperture extending through the package body and exposing the via capture pad; wherein the first circuit pattern further comprises: a bond pad via formed within the dielectric film and electrically connected to the bond pad, the trace electrically connecting the bond pad via to the via capture pad.

12. The fan out build up substrate stackable package of claim 11 further comprising: a buildup dielectric layer applied to the first surface of the package body, the second surface of the dielectric film, and to the first circuit pattern; and a second circuit pattern formed within the buildup dielectric layer and electrically connected to the first circuit pattern, the second circuit pattern comprising lands.

13. The fan out build up substrate stackable package of claim 11, wherein the dielectric film comprises a planar side surface extending between the first and second surfaces of the dielectric film.

14. The fan out build up substrate stackable package of claim 11, wherein: the electronic component comprises a side surface extending between the active surface and an inactive surface of the electronic component; the dielectric film comprises a side surface extending between the first and second surfaces of the dielectric film; and the side surface of the electronic component is coplanar with the side surface of the dielectric film.

15. A fan out build up substrate stackable package comprising: a plated via capture pad; an electronic component comprising an active surface comprising adhesive thereon; a package body encapsulating and directly contacting the via capture pad and sides of the electronic component; a via capture pad aperture extending through the package body and aligned with the via capture pad; a first buildup dielectric layer comprising a first surface applied to a first surface of the package body, the via capture pad, and the adhesive; and a first circuit pattern formed in the first buildup dielectric layer, the first circuit pattern being electrically connected to a bond pad on the active surface of the electronic component and to the via capture pad, the first circuit pattern comprising a trace embedded in the first buildup dielectric layer at a second surface of the first buildup dielectric layer, where the embedded trace runs parallel to the second surface of the first buildup dielectric layer, further comprising: a stacked flip chip electronic component mounted to an inactive surface of the electronic component through via terminals of the electronic component that terminate respective conductive vias extending through the electronic component, wherein the package body further encapsulates the stacked flip chip electronic component.

16. The fan out build up substrate stackable package of claim 15 further comprising solder on the via capture pad.

17. The fan out build up substrate stackable package of claim 15 further comprising: a plurality of via capture pads comprising the via capture pad; a stacked wirebond electronic component comprising an inactive surface mounted to an inactive surface of the electronic component; and bond wires electrically connecting bond pads on an active surface of the stacked wirebond electronic component to the via capture pads, wherein the package body further encapsulates the stacked wirebond electronic component and the bond wires.

* * * * *

UNITED STATES PATENT AND TRADEMARK OFFICE
CERTIFICATE OF CORRECTION

| | | |
|---|---|---|
| PATENT NO. | : 8,796,561 B1 | Page 1 of 1 |
| APPLICATION NO. | : 12/573466 | |
| DATED | : August 5, 2014 | |
| INVENTOR(S) | : Scanlan et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 601 days.

Signed and Sealed this
Fifteenth Day of September, 2015

Michelle K. Lee
*Director of the United States Patent and Trademark Office*